(12) United States Patent
Hwu et al.

(10) Patent No.: US 12,426,317 B2
(45) Date of Patent: Sep. 23, 2025

(54) SEMICONDUCTOR DEVICE AND MANUFACTURING METHOD THEREOF

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Jenn-Gwo Hwu, Taipei (TW); Jen-Hao Chen, Chiayi County (TW); Kung-Chu Chen, Chiayi (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 150 days.

(21) Appl. No.: 17/727,737

(22) Filed: Apr. 23, 2022

(65) Prior Publication Data

US 2023/0343859 A1 Oct. 26, 2023

(51) Int. Cl.
*H10D 48/38* (2025.01)
*H10D 48/00* (2025.01)
*H10D 48/32* (2025.01)

(52) U.S. Cl.
CPC ......... *H10D 48/366* (2025.01); *H10D 48/383* (2025.01)

(58) Field of Classification Search
CPC ....... H01L 2924/13072; H01L 27/0711; H01L 27/0738; H01L 27/0288; H01L 27/0629
See application file for complete search history.

(56) References Cited

U.S. PATENT DOCUMENTS

| | | | |
|---|---|---|---|
| 2006/0197118 A1* | 9/2006 | Migliorato | G01N 27/4145 257/253 |
| 2015/0234520 A1* | 8/2015 | Chen | G06F 3/04886 345/173 |
| 2018/0031520 A1* | 2/2018 | Tedesco | G01N 27/4145 |
| 2018/0106892 A1* | 4/2018 | Parascandola | H01L 27/14603 |
| 2019/0019838 A1* | 1/2019 | Kropelnicki | H01L 27/14629 |
| 2019/0138131 A1* | 5/2019 | Kim | G09G 3/2092 |
| 2020/0328257 A1* | 10/2020 | Kim | H10K 50/15 |

OTHER PUBLICATIONS

Chih-Shun Ding et al., "Gate-level Power Estimation Using Tagged Probabilistic Simulation", IEEE Transactions on Computer-Aided Design of Integrated Circuits and Systems, Dec. 1998.

(Continued)

*Primary Examiner* — Chad M Dicke
*Assistant Examiner* — Valerie N Newton
(74) *Attorney, Agent, or Firm* — Maschoff Brennan

(57) ABSTRACT

A semiconductor device includes a substrate, a sensing device, and a transistor. The sensing device includes a dielectric layer, a sensing pad, a first sensing electrode, and a second sensing electrode. The dielectric layer is over the substrate. The sensing pad is over and in contact with the dielectric layer. The first sensing electrode and the second sensing electrode are over and in contact with the dielectric layer. The first sensing electrode and the second sensing electrode surround the sensing pad, and a distance between the first sensing electrode and the second sensing electrode is greater than a distance between the sensing pad and the first sensing electrode. The transistor is over the substrate. A gate of the transistor is connected to the sensing pad.

20 Claims, 20 Drawing Sheets

(56) References Cited

OTHER PUBLICATIONS

Jing Guo et al., "A CMOS Majority Logic Gate and Its Application to One-Step ML Decodable Codes", IEEE Transactions on Very Large Scale Integration (VLSI) Systems, vol. 27, No. 11, 2019.
T. Fischer et al., "Experimental Prototype of a Spin-wave Majority Gate", Applied Physics Letters 110, 152401, Feb. 27, 2017.
Charles H. Roth et al., "Fundamentals of Logic Design, 7th Edition", Cengage Learning, Feb. 2013.

* cited by examiner

SEMICONDUCTOR DEVICE AND MANUFACTURING METHOD THEREOF

BACKGROUND

Logic gates are commonly used in computational IC circuit, which facilitates electronics device to implement complex functions. However, in order to construct a logic function accommodating multiple inputs or carrying out sophisticated logic computation, several standard transistors are used to be connected to form a logic gates chain. Under this circumstance, this long logic gate chain will engender a huge occupation area consumption and relatively larger power consumption on IC chip, which is unfavorable to fabrication scaling.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
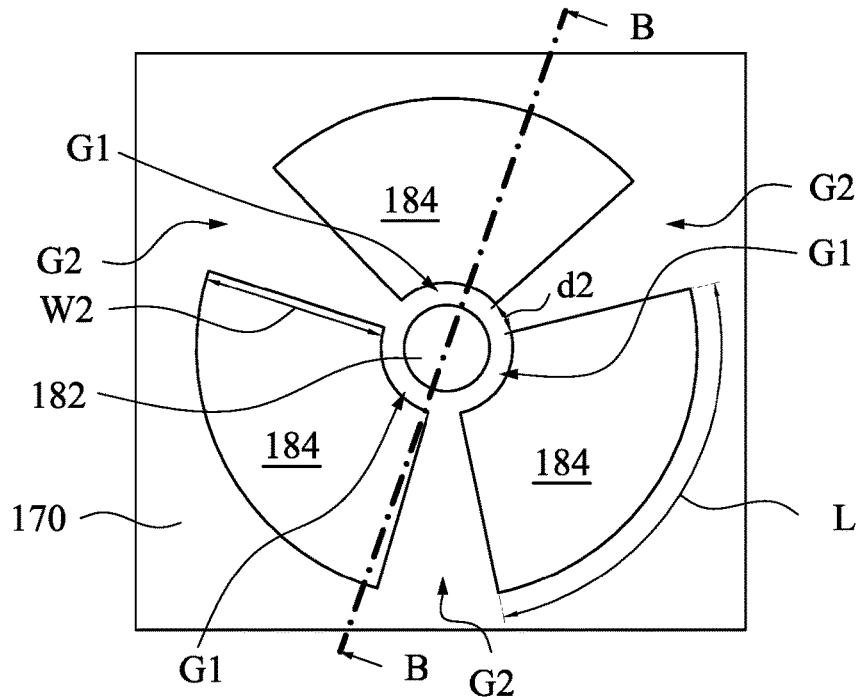
FIG. 1A is a top view of a sensing device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

This disclosure relates to semiconductor devices including sensing devices and more specifically to multi-level sensing devices each including a sensing pad coupled with multiple electrodes through tunneling effect. The sensing devices can perform different logic computations with low power consumption and small occupation area. Such structure and its methods provide a new type sensing device and do not add area burden to the device.

Figure 1B:
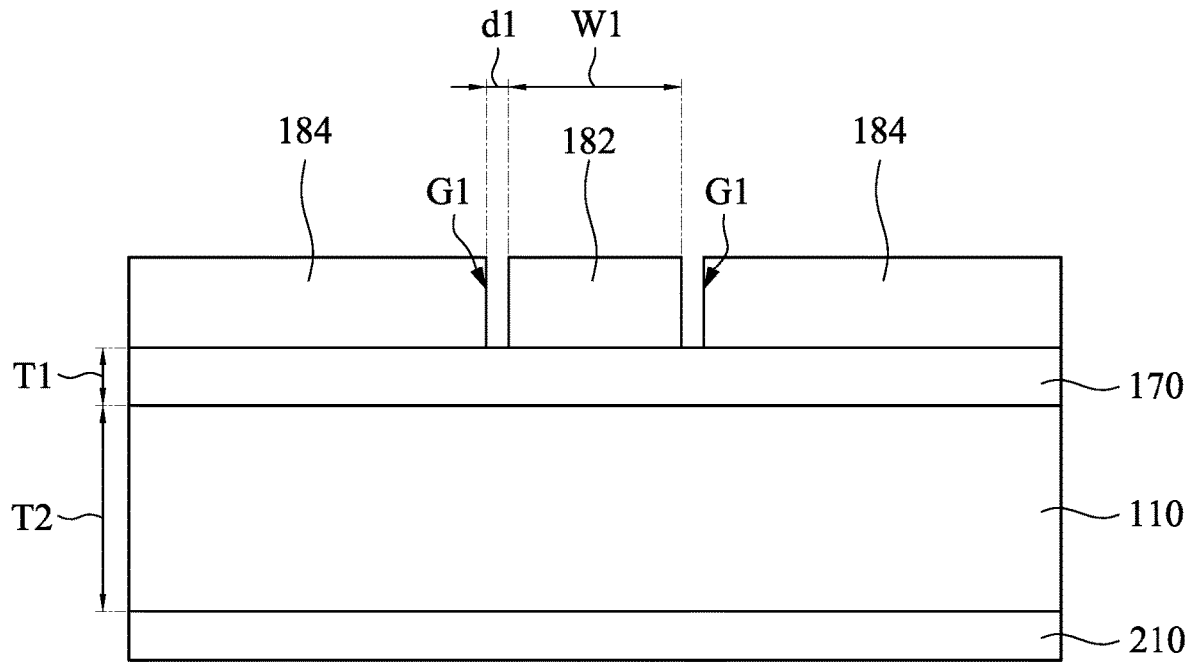
FIG. 1B is a cross-sectional view taken along line B-B of FIG. 1A.

FIG. 1A is a top view of a sensing device 100 in accordance with some embodiments of the present disclosure, and FIG. 1B is a cross-sectional view taken along line B-B of FIG. 1A. The sensing device 100 includes a semiconductor substrate 110, a dielectric layer 170, a sensing pad 182, and a plurality of sensing electrodes 184. The dielectric layer 170 is over the semiconductor substrate 110. The sensing pad 182 and the sensing electrodes 184 are over and in contact with the dielectric layer 170. The sensing pad 182 and the sensing electrodes 184 are spaced apart from each other, and the sensing electrodes 184 surround the sensing pad 182. It can be appreciated that any number of the sensing electrodes 184 can be formed; the number of the sensing electrodes 184 depending on the number of inputs. In some embodiments, the number of sensing electrodes 184 can be 1 or greater than 1 (e.g., about 100).

During operation (at room temperature), input voltage(s) can be applied to at least one of the sensing electrodes 184, and tunneling coupling is formed between the at least one sensing electrode 184 and the sensing pad 182 through the dielectric layer 170. For example, when the sensing electrode 184 and the sensing pad 182 are disposed closed enough, charge coupling phenomenon is formed between the sensing electrode 184 and the sensing pad 182 through the dielectric layer 170. The inversion electrons under the sensing electrode 184 flow toward the sensing pad 182 through the dielectric layer 170 by diffusion and fringing field attraction. As such, an open-circuit voltage can be read out at the sensing pad 182, which serves as an output pad of the sensing device 100. The value of the output signal of the sensing pad 182 is related to the numbers of the sensing electrodes 184 with the input voltages. For example, more sensing electrodes 184 are applied with the input voltages, the higher output signal is read. Hence, the sensing device 100 can function as a logic gate (e.g., AND, OR, NOT, or other logic gates) with a small layout area and low power consumption. For example, the power of the sensing device 100 is lower than about 130 pW with input voltages lower than about 1 V.

The sensing pad 182 and the sensing electrodes 184 are made of conductive materials. In some embodiments, the sensing pad 182 has a circular shape, and each of the sensing electrodes 184 has an annulus sector shape. The sensing pad 182 and each of the sensing electrodes 184 define a gap G1 therebetween, and adjacent two of the sensing electrodes 184 define a gap G2 therebetween. The gap G1 has a width d1, and the gap G2 has a (minimum) width d2 (i.e., a distance between adjacent sensing electrodes 184) greater than the width d1 of the gap G1. As such, the adjacent sensing electrodes 184 do not disturb (or tunneling couple with) each other while each of the sensing electrodes 184 tunneling couples with the sensing pad 182. Further, the width d1 of the gap G1 is in a range from about 0.1 nm to about 100 um. The width d1 of the gap G1 is greater than about 0.1 nm to prevent parasitic capacitance between the sensing pad 182 and each of the sensing electrodes 184, which may disturb the output value of the sensing pad 182.

The sensing pad 182 has a width (or diameter) W1, and each of the sensing electrodes 184 has a width W2. In some embodiments, the width W2 of each of the sensing electrodes 184 is greater than a width W1 of the sensing pad 182. For example, the ratio of the width W1 to the width W2 is in a range from about 0.1 to about 1. In some embodiments, an area of each of the sensing electrodes 184 in the top view (as shown in FIG. 1A) is greater than an area of the sensing pad 182. In some embodiments, the width d1 of the gap G1 is smaller than the width W1 of the sensing pad 182, and the width d1 of the gap G1 is smaller than the width W2 of the sensing electrodes 184. With the aforementioned dimensions, each of the sensing electrodes 184 can provide adequate inversion electrons to the sensing pad 182, and the sensing pad 182 is sensitive to the voltage difference of each of the sensing electrodes 184.

In some embodiments, arc lengths L of the sensing electrodes 184 are substantially the same, and the widths W2 of the sensing electrodes 184 are substantially the same, such that the sensing electrodes 184 have substantially the same area in the top view. With this configuration, the sensing electrodes 184 have the same weight to the output signal of the sensing pad 182. In some other embodiments, the arc lengths L and/or the widths W2 may be different among the sensing electrodes 184 (see FIG. 5). With such configuration, the sensing electrodes have different weights to the output signal of the sensing pad 182.

The dielectric layer 170 is between the sensing pad 182 and the semiconductor substrate 110 and also between the sensing electrodes 184 and the semiconductor substrate 110. Further, the sensing pad 182 and the sensing electrodes 184 are in contact with the dielectric layer 170. At least the gaps G1 expose the dielectric layer 170, such that the inversion electrons under the sensing electrodes 184 can flow through the dielectric layer 170 to the sensing pad 182. Stated another way, portions of the dielectric layer 170 respectively extend from beneath the sensing electrode 184 to the sensing pad 182. In some embodiments, the dielectric layer 170 has a thickness T1 in a range from about 10 angstrom to about 40 angstrom. If the thickness T1 is out of this range, tunneling effect may not occur in the dielectric layer 170, and an output signal may not be read from the sensing pad 182.

The semiconductor substrate 110 has a thickness T2 greater than the thickness T1. In some embodiments, the thickness T2 of the semiconductor substrate 110 is in a range from about 1 um to about 100 um, such that the semiconductor substrate 110 is a bulk substrate which may be considered to be a (electrical) ground. In some embodiments, the sensing device 100 further includes a backside electrode 210 under the semiconductor substrate 110 and directly under the sensing pad 182 and the sensing electrodes 184. The backside electrode 210 is configured to be electrically connected to a ground source to provide a ground signal to the semiconductor substrate 110. The grounded semiconductor substrate 110 prevents electrical noises (if any) in the semiconductor substrate 110 from disturbing the output signal read from the sensing pad 182.

Figure 2A:
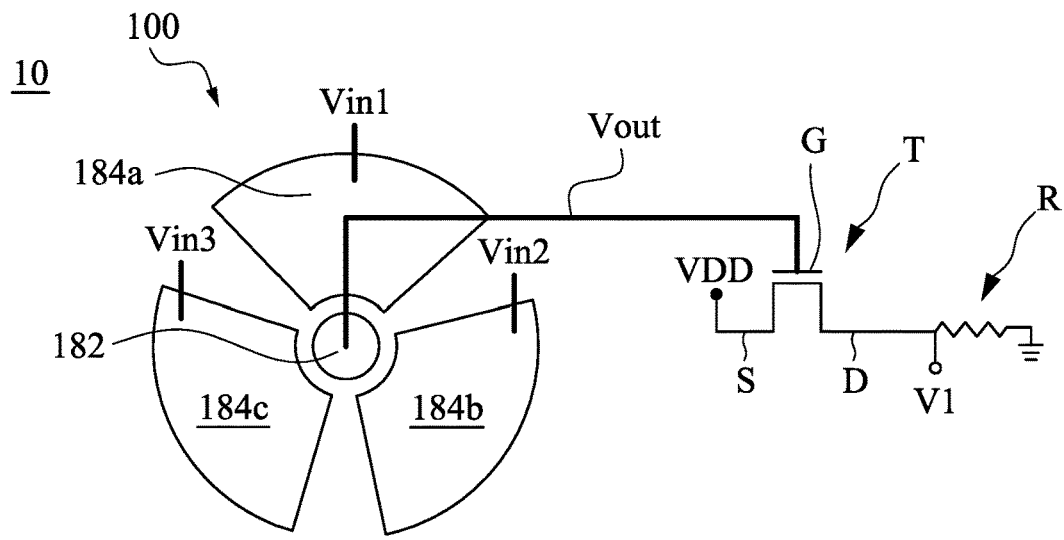
FIG. 2A is a circuit diagram of the sensing device applied to a semiconductor device (or a logic circuit) in accordance with some embodiments of the present disclosure.
Figure 2B:
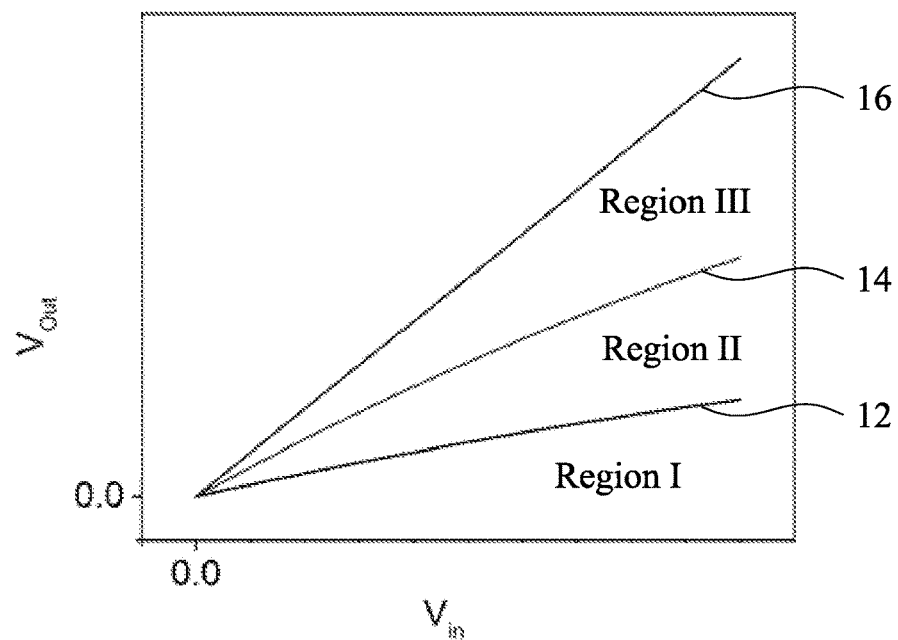
FIG. 2B is a diagram of Vin-Vout curves of the sensing device in FIG. 2A.

FIG. 2A is a circuit diagram of the sensing device 100 applied to a semiconductor device (or a logic circuit) 10 in accordance with some embodiments of the present disclosure, and FIG. 2B is a diagram of Vin-Vout curves of the sensing device 100 in FIG. 2A. In FIG. 2A, the sensing device 100 includes three (identical) sensing electrodes 184a, 184b, and 184c. In some embodiments, an input signal is applied to one of the sensing electrodes 184a, 184b, 184c while the other two of the sensing electrodes 184a, 184b, 184c are grounded, and the Vin-Vout signal is illustrated as the line 12 in FIG. 2B. In some other embodiments, input signals are applied to two of the sensing electrodes 184a, 184b, 184c while the rest one of the sensing electrode 184a, 184b, 184c is grounded, and the Vin-Vout signal is illustrated as the line 14 in FIG. 2B. In still some other embodiments, input signals are applied to the sensing electrodes 184a, 184b, and 184c respectively, and the Vin-Vout signal is illustrated as the line 16 in FIG. 2B.

In FIG. 2A, the logic circuit 10 further includes a transistor T connected to the sensing pad 182. Specifically, a gate G of the transistor T connected to the sensing pad 182, and a source S of the transistor T is connected to a power source VDD. Further, the transistor T is electrically isolated from the sensing electrodes 184a, 184b, and 184c. The transistor T has a threshold voltage (Vth) which is predetermined. For example, as shown by the example truth and false data in Table I, in cases that the transistor T has a threshold voltage located in the region I in FIG. 2B, the channel of the transistor T is turned off (e.g., state 0) when all of the inputs Vin1, Vin2, and Vin3 are grounded and the channel of the transistor T is turned on (e.g., state 1) when the input voltage is applied to at least one of the inputs Vin1, Vin2, and Vin3; in cases that the transistor T has a threshold voltage located in the region II in FIG. 2B, the channel of the transistor T is turned off (e.g., state 0) when the input signal is applied to none or only one of the inputs Vin1, Vin2, and Vin3 and the channel of the transistor T is turned on (e.g., state 1) when the input voltages are applied to two or three of the inputs Vin1, Vin2, and Vin3; in cases that the transistor T has a threshold voltage located in the region III in FIG. 2B, the channel of the transistor T is turned off (e.g., state 0, False) when the input signal(s) is(are) applied to two or less of the inputs Vin1, Vin2, and Vin3 and the channel of the transistor T is turned on (e.g., state 1, Truth) when the input voltages are applied to all of the inputs Vin1, Vin2, and Vin3. Therefore, the logic circuit 10 can perform different operators/logic gates with different threshold voltages of the transistor T. In the (Vin1, Vin2, Vin3) column of Table I, the input voltage, which is greater than 0V, represents "1", and the ground potential represents "0".

TABLE I

Truth (state 1) and False (state 0) of Logic Circuit

| (Vin1, Vin2, Vin3) | Vth in Region I (OR) | Vth in Region II (Majority) | Vth in Region III (AND) |
|---|---|---|---|
| (000) | 0 | 0 | 0 |
| (100) (010) (001) | 1 | 0 | 0 |
| (110) (101) (001) | 1 | 1 | 0 |
| (111) | 1 | 1 | 1 |

In some embodiments, instead of reading the current value of the transistor T, a resistor R can be connected to the drain D of the transistor T such that a voltage V1 can be read to determine the state (0 or 1) of the logic circuit 10. For example, a terminal of the resistor R is connected to the drain D of the transistor T, and another terminal of the resistor R is grounded or connected to a reference voltage.

FIGS. 3A-3J illustrate cross-sectional views of intermediate stages in the formation of a semiconductor device including a sensing device in accordance with some embodiments of the present disclosure. Throughout the various illustrative embodiments, like reference numbers are used to designate like elements. It is understood that additional operations can be provided before, during, and after the processes shown by FIGS. 3A-3J, and some of the operations described below can be replaced or eliminated, for additional embodiments of the method. The order of the operations/processes may be interchangeable.

Figure 3A:
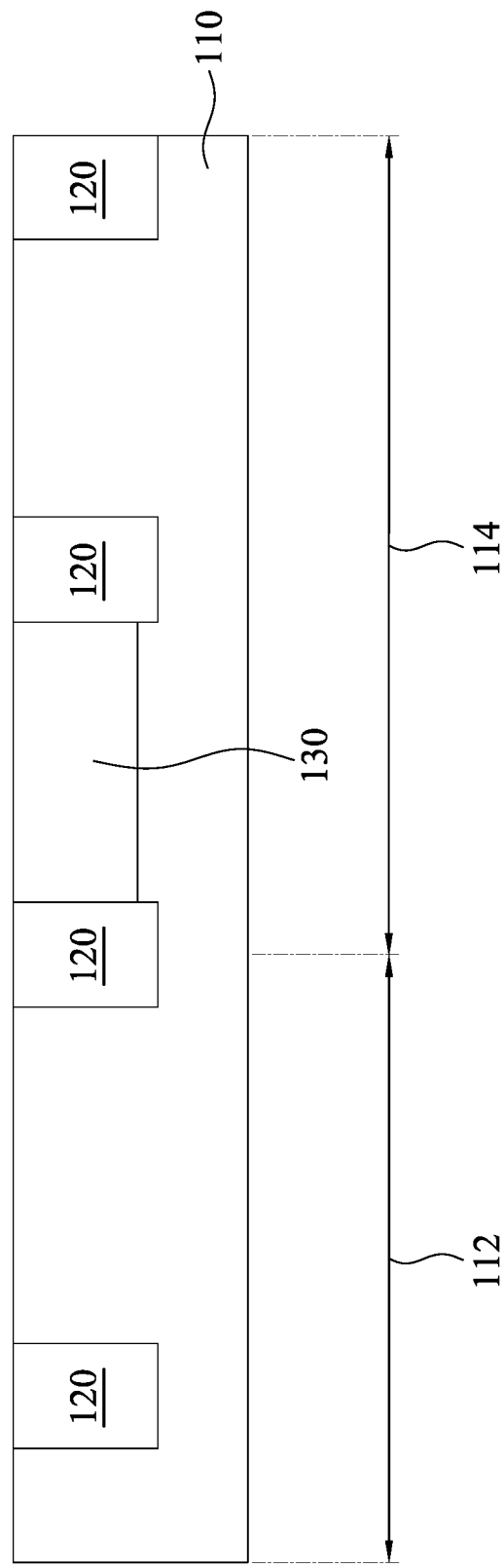
FIGS. 3A-3J illustrate cross-sectional views of intermediate stages in the formation of a semiconductor device including a sensing device in accordance with some embodiments of the present disclosure.

Reference is made to FIG. 3A. A semiconductor substrate 110 is provided. The semiconductor substrate 110 has a sensing region 112 and a transistor region 114. In some embodiments, the semiconductor substrate 110 is a semiconductor material and thus may be referred to as a semiconductive layer. The semiconductor substrate 110 may include a graded layer or a buried oxide, for example. In some embodiments, the semiconductor substrate 110 includes bulk silicon that may be undoped or doped (e.g., p-type, n-type, or a combination thereof). Other materials that are suitable for semiconductor device formation may be used. Other materials, such as germanium or GaAs could alternatively be used for the semiconductor substrate 110. Alternatively, the silicon substrate 110 may be a multi-layered structure such as a silicon-germanium layer formed on a bulk silicon layer. In the some embodiments, illustrated as an n-type MOS, the semiconductor substrate 110 includes a p-type silicon substrate (p-substrate). For example, p-type dopants are introduced/implanted/doped into the semiconductor substrate 110 to form the p-substrate.

A plurality of isolation structures 120 are formed in the semiconductor substrate 110. The isolation structures 120 may be formed by chemical vapor deposition (CVD) techniques using tetra-ethyl-ortho-silicate (TEOS) and oxygen as a precursor. In some other embodiments, the isolation structures 120 may be formed by implanting ions, such as oxygen, nitrogen, carbon, or the like, into the semiconductor substrate 110. In yet some other embodiments, the isolation structures 120 are insulator layers of a SOI wafer. The isolation structures 120, which act as shallow trench isolations (STIs), are formed in and/or between the sensing region 112 and the transistor region 114. That is, the isolation structures 120 define the sensing region 112 and the transistor region 114.

Subsequently, a doping region 130 is formed in the semiconductor substrate 110. In some embodiments, the doping region 130 is formed by ion implantation. In some embodiments, arsenic or phosphorus ions are implanted to form the doping region 130. The doping region 130 has a first conductivity type while the semiconductor substrate 110 has a second conductivity type. For example, the doping region 130 is n-type, and the semiconductor substrate 110 is p-type.

Figure 3B:
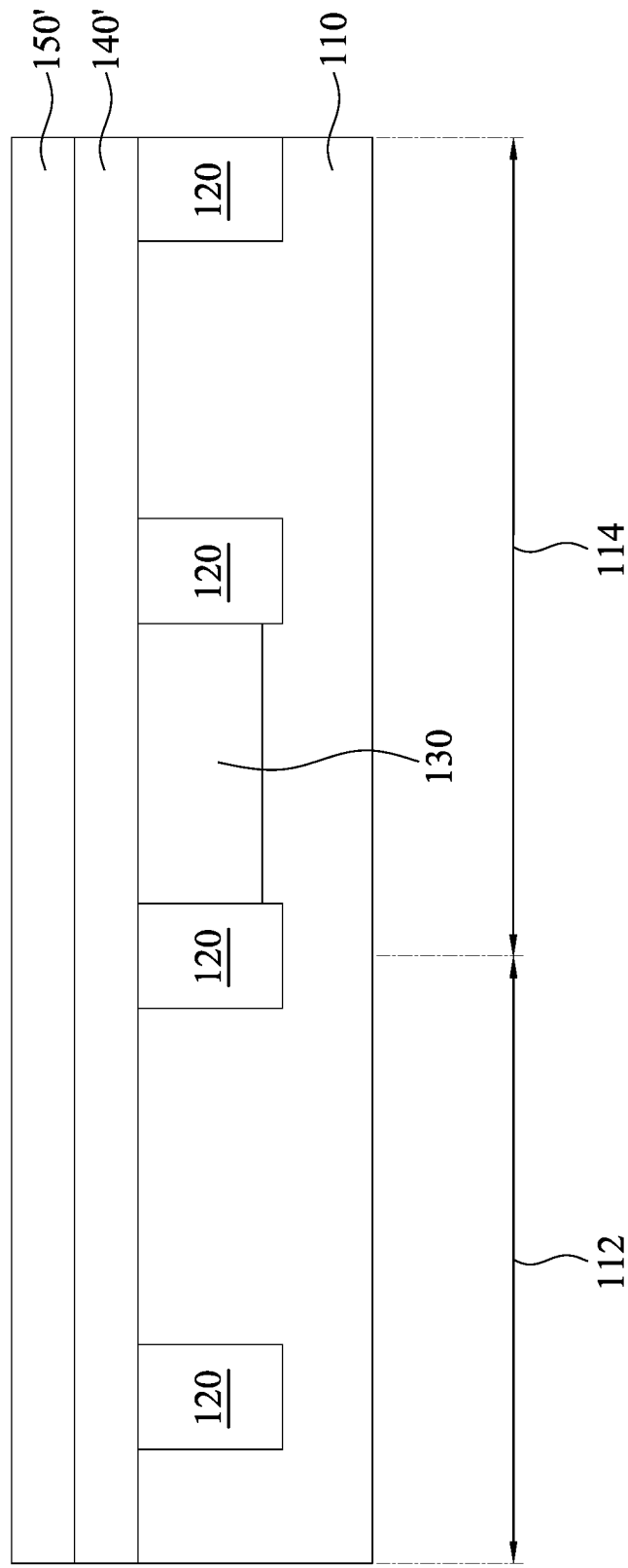

Reference is made to FIG. 3B. A gate dielectric film 140' and a conductive film 150' are subsequently formed above the semiconductor substrate 110. The gate dielectric film 140' may include a silicon oxide layer. Alternatively, the gate dielectric film 140' may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. The gate dielectric film 140' may have a multilayer structure such as one layer of silicon oxide and another layer of high k material. The gate dielectric film 140' may be formed using chemical vapor deposition (CVD), physical vapor deposition (PVD), atomic layer deposition (ALD), thermal oxide, other suitable processes, or combinations thereof.

The conductive film 150' may include a polycrystalline silicon (or polysilicon). Alternatively, the conductive film 150' may include a metal such as Al, Cu, W, Ti, Ta, TiN, TaN, NiSi, CoSi, other suitable conductive materials, or combinations thereof. The conductive film 150' may be formed by CVD, PVD, plating, and other proper processes. The conductive film 150' may have a multilayer structure and may be formed in a multi-step process using a combination of different processes.

Figure 3C:
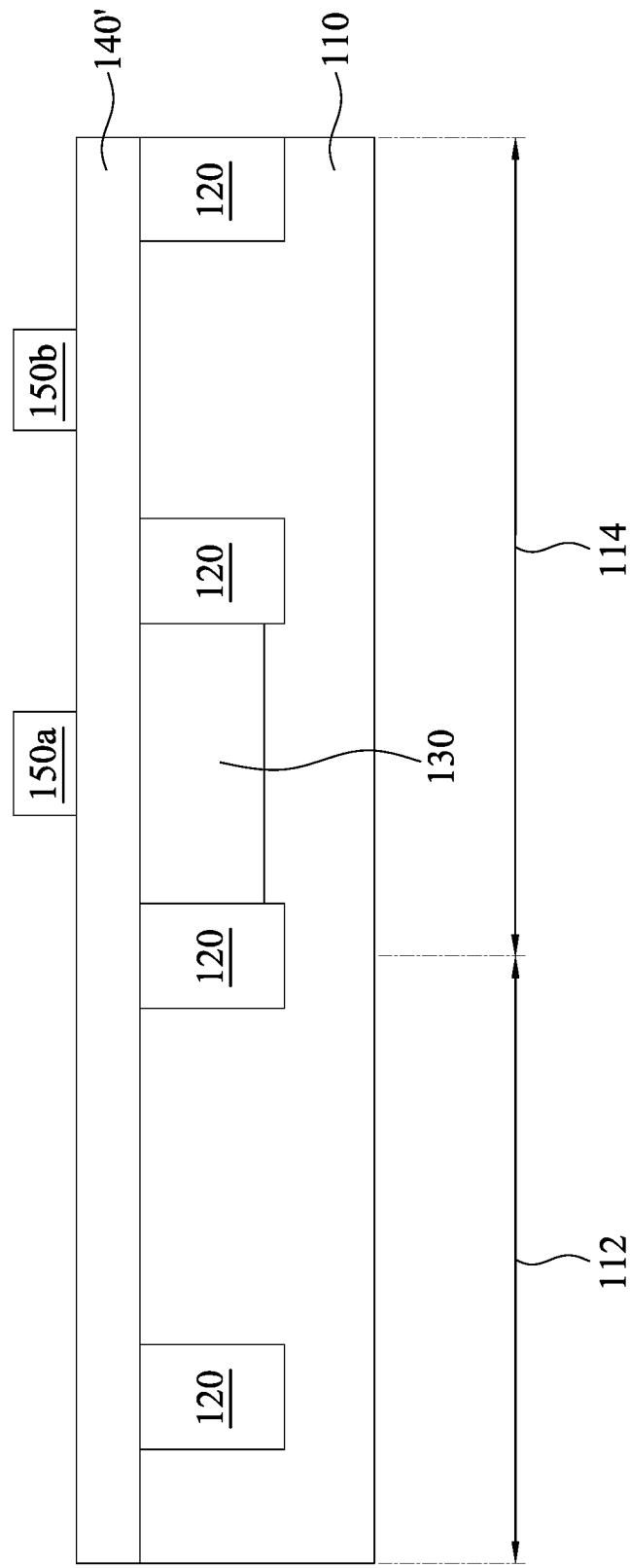

Reference is made to FIG. 3C. The conductive film 150' in FIG. 3B is patterned to be gate electrodes 150a and 150b. The gate electrodes 150a and 150b are over the transistor region 114 of the semiconductor substrate 110. An exemplary method for patterning the conductive film 150' is described below. A layer of photoresist is formed on the conductive film 150' by a suitable process, such as spin-on coating, and then patterned to form a patterned photoresist feature by a proper lithography patterning method. The pattern of the photoresist may then be transferred by an etching process to the underlying conductive film 150', in a plurality of processing operations and various proper sequences. The photoresist layer may be stripped thereafter. In still some other embodiments, a hard mask layer may be used and formed on the conductive film 150'. The patterned photoresist layer is formed on the hard mask layer. The pattern of the photoresist layer is transferred to the hard mask layer and then transferred to the conductive film 150'. The hard mask layer may include silicon nitride, silicon oxynitride, silicon carbide, and/or other suitable dielectric materials, and may be formed using a method such as CVD or PVD.

Figure 3D:
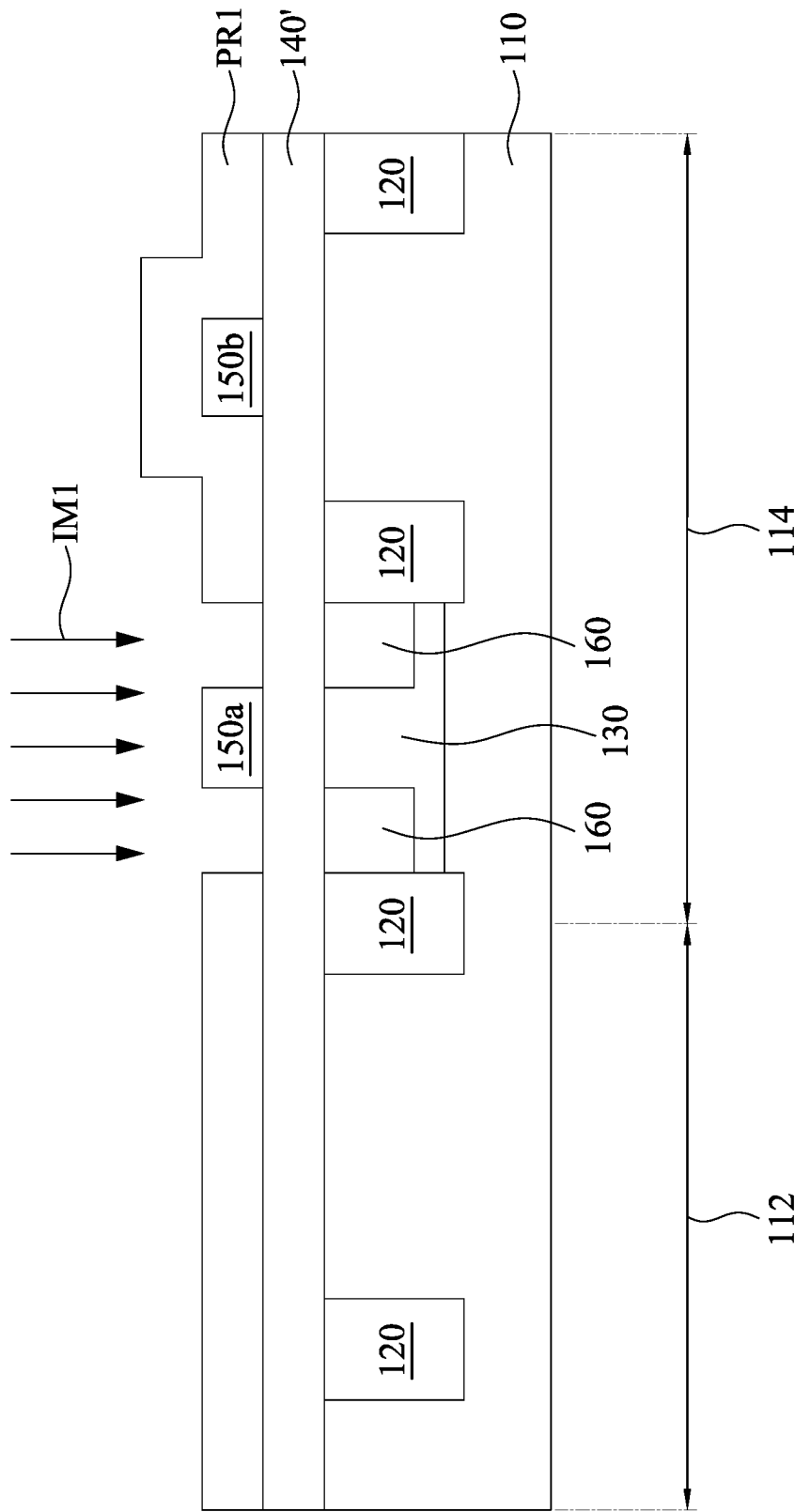

Reference is made to FIG. 3D. First source/drain regions 160 are formed in the doping region 130. The first source/drain regions 160 are heavily doped regions. In some embodiments, the first source/drain regions 160 include p-type dopants such as boron, boron difluoride, or combinations thereof. The first source/drain regions 160 may be formed by a method such as ion implantation or diffusion. For example, a layer of photoresist PR1 is formed on the semiconductor substrate 110 by a suitable process, such as spin-on coating, and then patterned to form a patterned photoresist feature by a proper lithography patterning method. Thereafter, an implantation process IM1 is performed to dope dopants in the doping region 130. The first source/drain regions 160 have the second conductivity type while the doping region 130 has the first conductivity type. For example, the first source/drain regions 160 are p-type, and the doping region 130 is n-type.

Figure 3E:
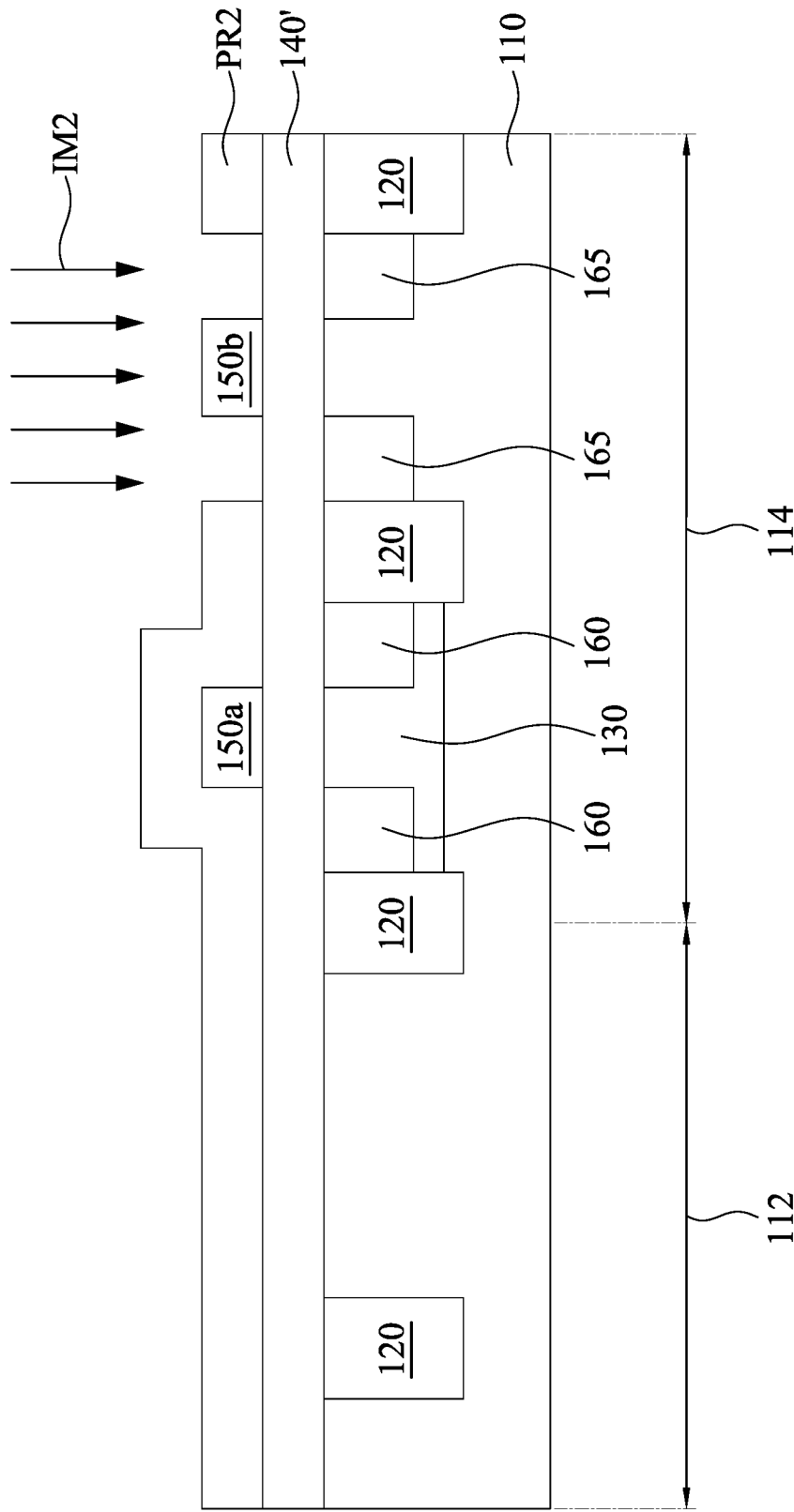

Reference is made to FIG. 3E. Second source/drain regions 165 are formed in the semiconductor substrate 110. The second source/drain regions 165 are heavily doped regions. In some embodiments, the second source/drain regions 165 include n-type dopants such as arsenic, phosphorus, or combinations thereof. The second source/drain regions 165 may be formed by a method such as ion implantation or diffusion. For example, the photoresist PR1 shown in FIG. 3D is removed, and another layer of photoresist PR2 is formed on the semiconductor substrate 110 by a suitable process, such as spin-on coating, and then patterned to form a patterned photoresist feature by a proper lithography patterning method. Thereafter, an implantation process IM2 is performed to dope dopants in the semiconductor substrate 110. The second source/drain regions 165 have the first conductivity type while the semiconductor substrate 110 has the second conductivity type. For example, the second source/drain regions 165 are n-type, and the semiconductor substrate 110 is p-type.

Figure 3F:
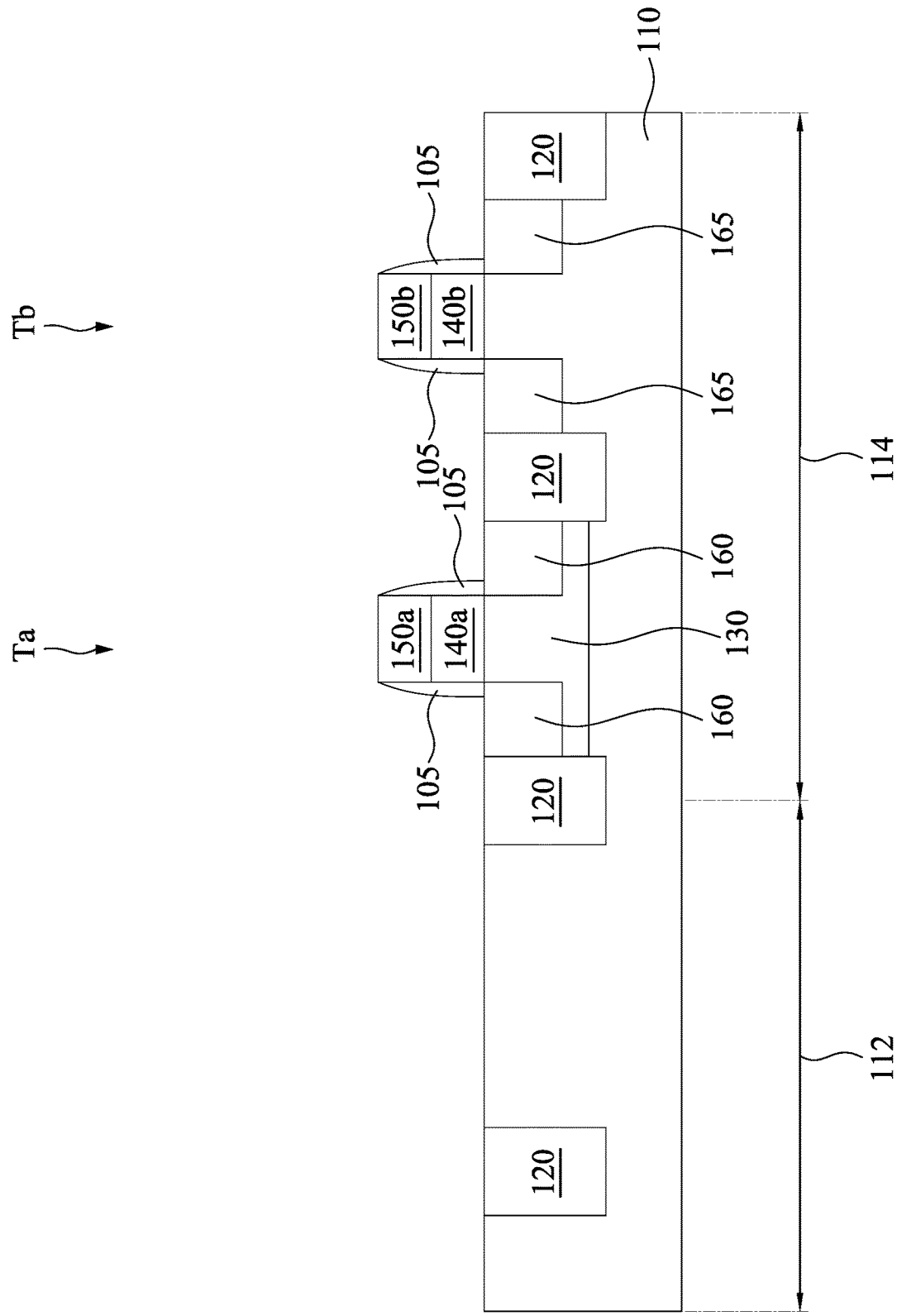

Reference is made to FIG. 3F. The photoresist PR2 in FIG. 3E is stripped. The gate dielectric film 140' in FIG. 3E is then patterned to be gate dielectric layers 140a and 140b by using the gate electrodes 150a and 150b as etching masks. As such, the gate dielectric layer 140a is formed between the gate electrode 150a and the semiconductor substrate 110, and the gate dielectric layer 140b is formed between the gate electrode 150b and the semiconductor substrate 110. The gate dielectric layer 140a, the gate electrode 150a, the first source/drain regions 160, and a portion of the doping region 130 (referring as a channel region) between the first source/drain regions 160 form a transistor Ta, and the gate dielectric layer 140b, the gate electrode 150b, the second source/drain regions 165, and a portion of the semiconductor substrate 110 (referring as a channel region) between the second source/drain regions 165 form a transistor Tb.

Optionally, gate spacers 105 are formed on sidewalls of the gate electrodes 150a, 150b and the gate dielectric layer 140a, 140b. For example, a spacer material layer is deposited on the semiconductor substrate 110. The spacer material layer may be a conformal layer that is subsequently etched back to form the gate spacers 105. The gate spacers 105 may include a dielectric material such as silicon oxide, silicon nitride, silicon carbide, silicon oxynitride, SiCN films, silicon oxycarbide, SiOCN films, and/or combinations thereof.

Figure 3G:
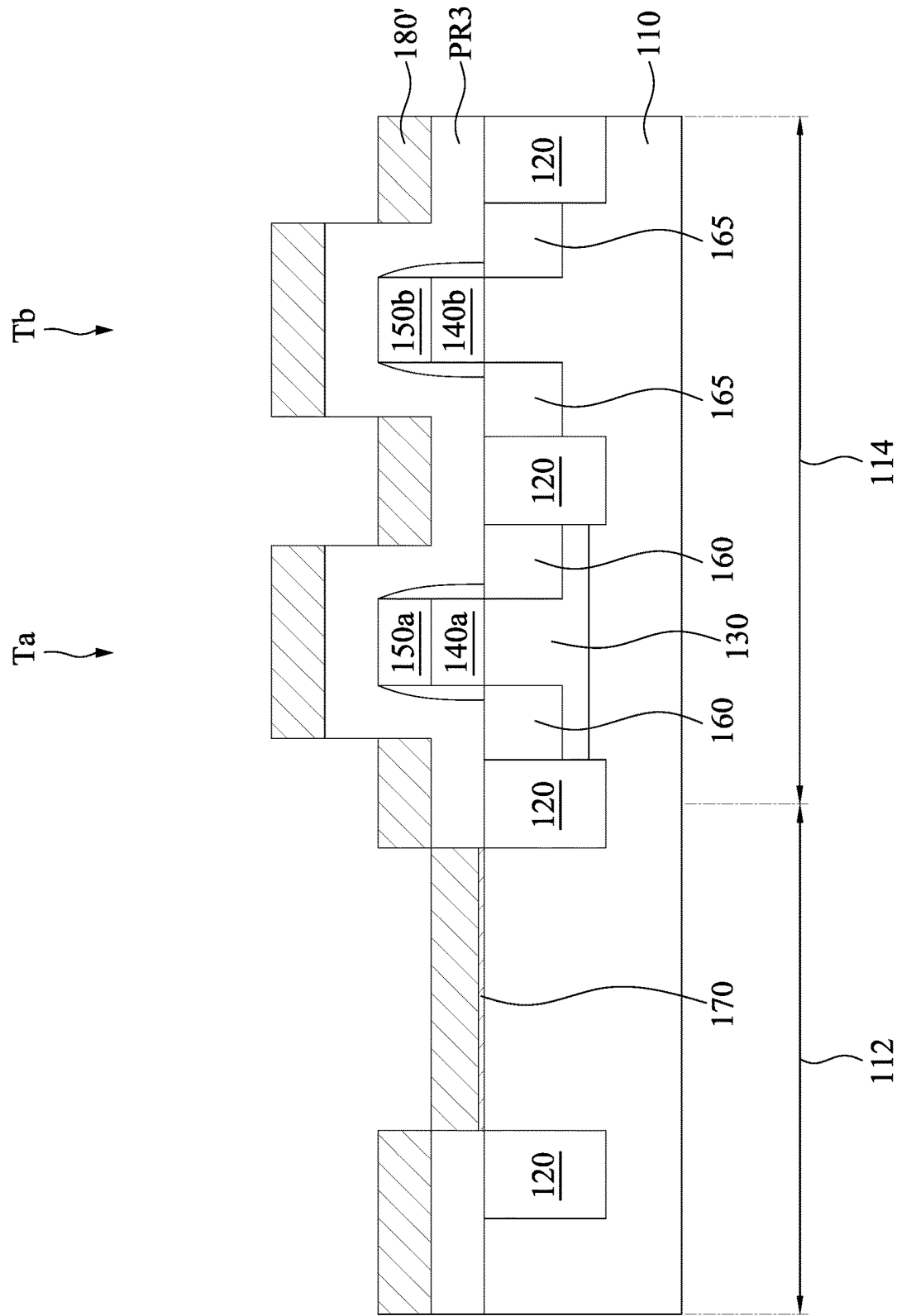

Reference is made to FIG. 3G. Another photoresist PR3 is formed on the semiconductor substrate 110 and exposes a top surface of the sensing region 112 of the semiconductor substrate 110. A dielectric layer 170 is formed on the top surface of the sensing region 112 of the semiconductor substrate 110. The dielectric layer 170 may include a silicon oxide layer. Alternatively, the dielectric layer 170 may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. The dielectric layer 170 may be formed using thermal oxide, chemical vapor deposition (CVD), physical vapor deposition (PVD), atomic layer deposition (ALD), other suitable processes, or combinations thereof.

Thereafter, a conductive film 180' is formed over the dielectric layer 170 and the photoresist PR3. The conductive film 180' is deposited in a downwards direction in some embodiments. The conductive film 180' may include a metal such as Al, Cu, W, Ti, Ta, TIN, TaN, NiSi, CoSi, other suitable conductive materials, or combinations thereof. Alternatively, the conductive film 180' may include a polycrystalline silicon (or polysilicon). The conductive film 180' may be formed by CVD, PVD, plating, and other proper processes. The conductive film 180' may have a multilayer structure and may be formed in a multi-step process using a combination of different processes.

Figure 3H:
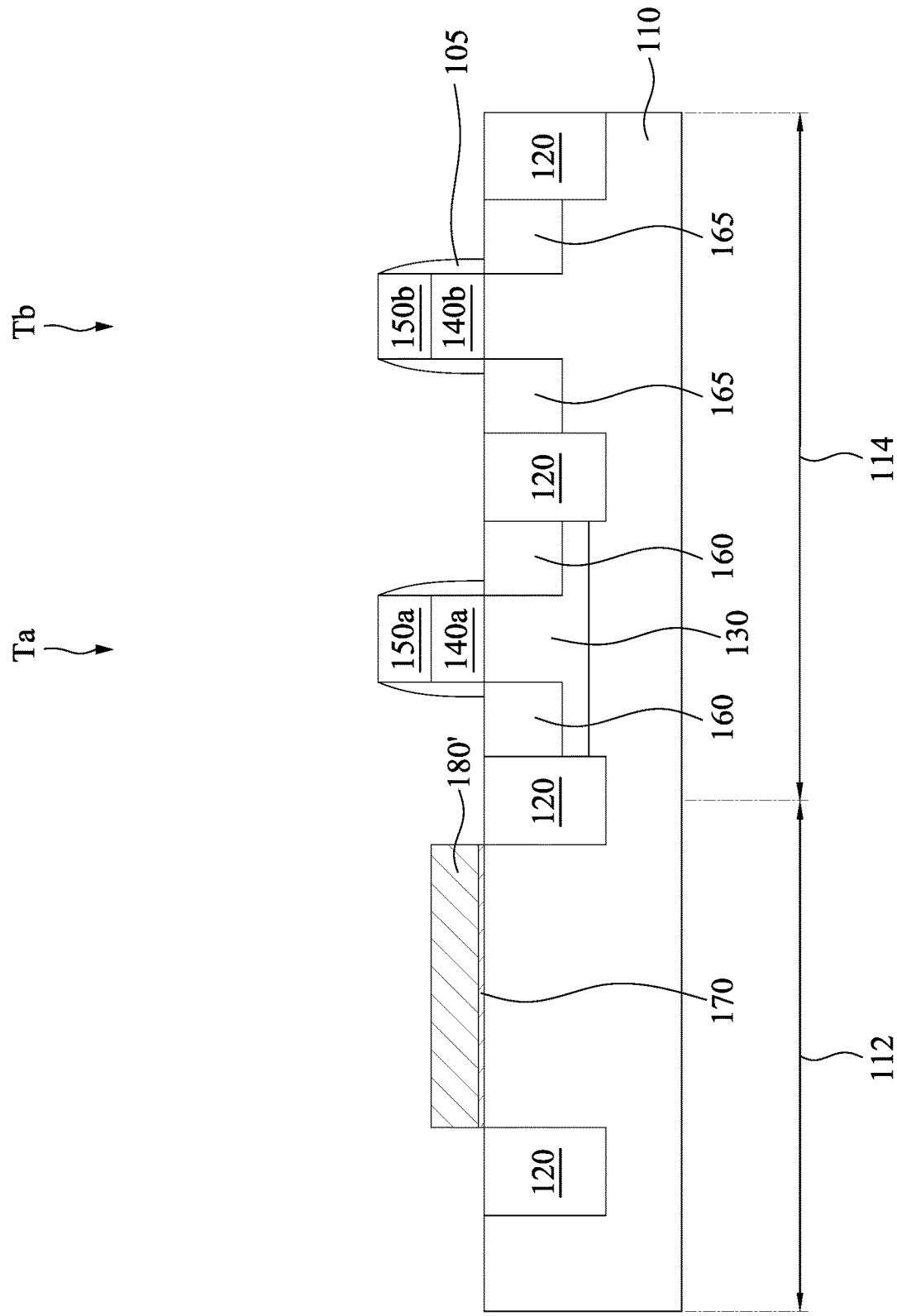

Reference is made to FIG. 3H. The photoresist PR3 is stripped, such that portions of the conductive film 180' over the photoresist PR3 are removed as well. The remaining portion of the conductive film 180' is over the dielectric layer 170.

Figure 3I:
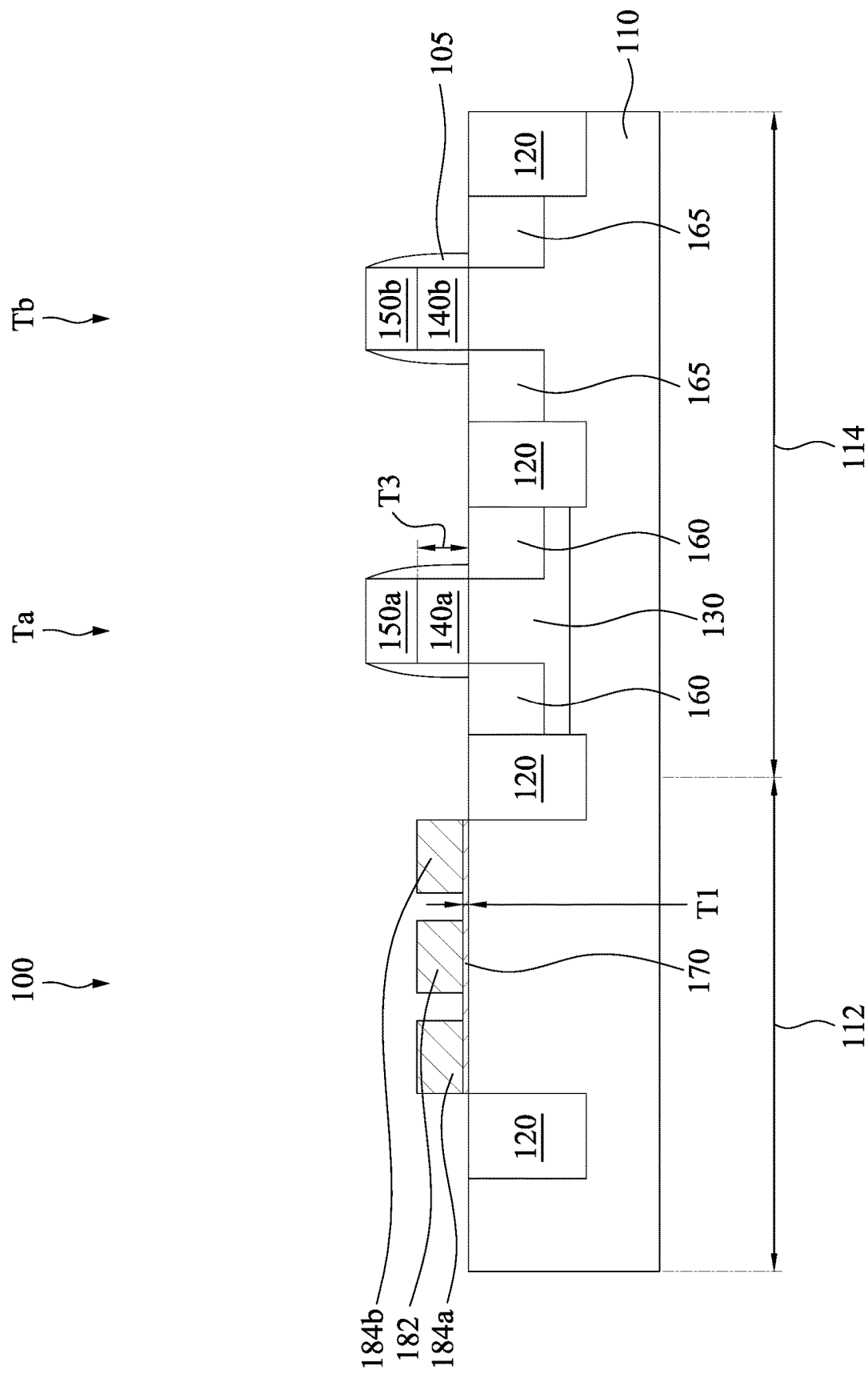

Reference is made to FIG. 3I. The remaining portion of the conductive film 180' in FIG. 3H is patterned to be a sensing pad 182 and a plurality of sensing electrodes (e.g., sensing electrodes 184a and 184b) surrounding the sensing pad 182. For example, a layer of photoresist is formed on the conductive film 180' by a suitable process, such as spin-on coating, and then patterned to form a patterned photoresist by a proper lithography patterning method. The pattern of the photoresist may then be transferred by a dry etching process to the underlying conductive film 180', in a plurality of processing operations and various proper sequences. The photoresist layer may be stripped thereafter. In still some other embodiments, a hard mask layer may be used and formed on the conductive film 180'. The patterned photoresist layer is formed on the hard mask layer. The pattern of the photoresist layer is transferred to the hard mask layer and then transferred to the conductive film 180'. The hard mask layer may include silicon nitride, silicon oxynitride, silicon carbide, and/or other suitable dielectric materials, and may be formed using a method such as CVD or PVD.

As such, a sensing device 100 is formed. In FIG. 3I, the sensing device 100 includes the semiconductor substrate 110, the dielectric layer 170, the sensing pad 182, and the sensing electrodes (e.g., sensing electrodes 184a and 184b). The top view of the sensing device 100 is similar to that shown in FIG. 1A. In some embodiments, a thickness T1 of the dielectric layer 170 is smaller than a thickness T3 of each of the gate dielectric layers 140a and 140b. With a thinner thickness T1, the dielectric layer 170 provides the tunneling effect between the sensing pad 182 and the sensing electrodes. With a thicker thickness T3, the gate dielectric layer 140a (140b) provides sufficient isolation between the gate electrode 150a (150b) and the channel of the transistor Ta (Tb).

Figure 3J:
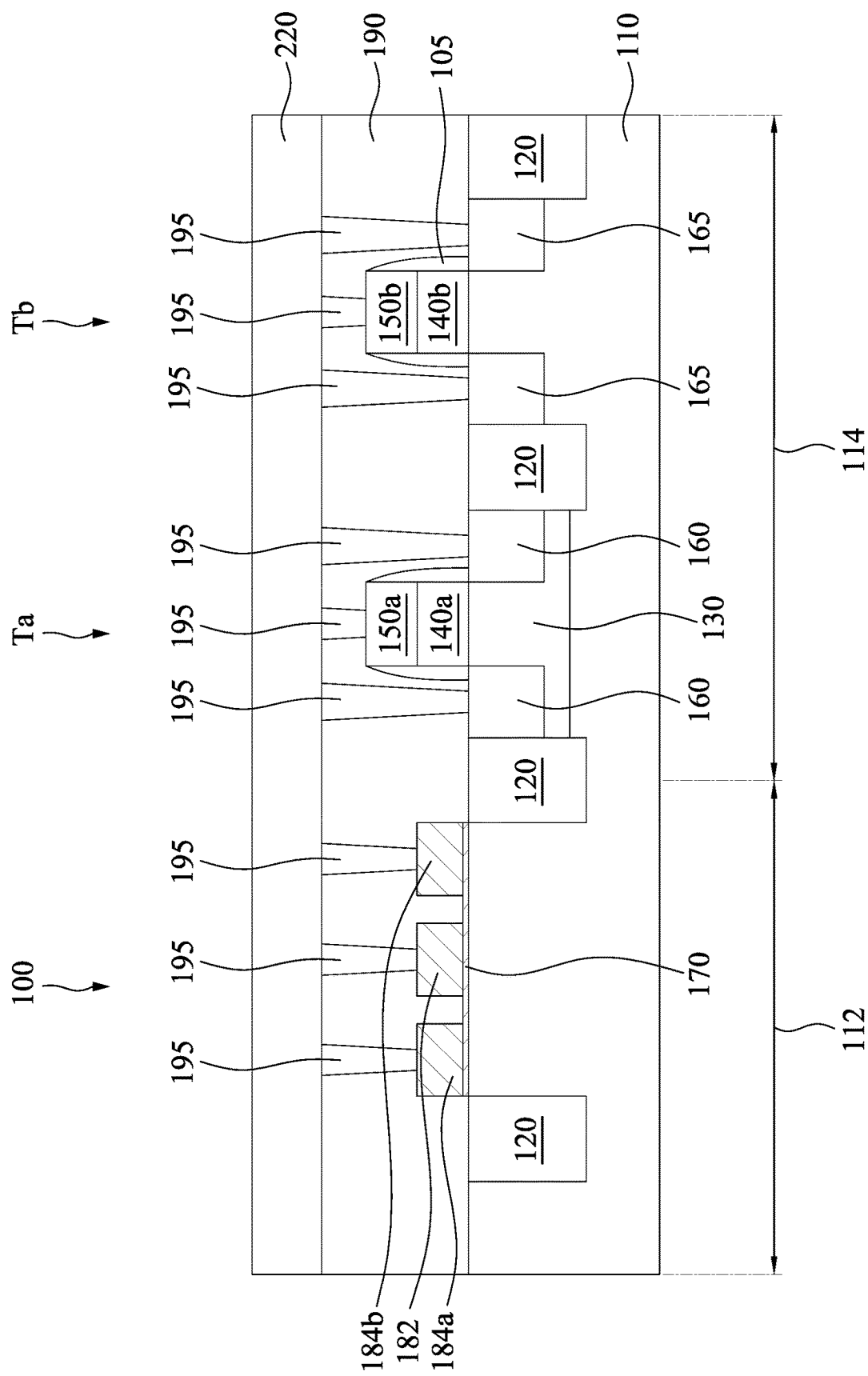

Reference is made to FIG. 3J. A plurality of contacts 195 are formed over the transistors Ta, Tb, and the sensing device 100. For example, an interlayer dielectric (ILD) layer 190 is formed over the transistors Ta, Tb, and the sensing device 100. In some embodiments, the ILD layer 190 is formed by depositing a dielectric material over the transistors Ta, Tb, and the sensing device 100 and then a planarization process is performed to the dielectric material. In some embodiments, the deposition process may be chemical vapor deposition (CVD), high-density plasma CVD, spin-on, sputtering, or other suitable methods. In some embodiments, the ILD layer 190 includes silicon oxide. In some other embodiments, the ILD layer 190 may include silicon oxy-nitride, silicon nitride, or a low-k material. Next, openings are formed in the ILD layer 190, and conductive materials are filled in the openings. The excess portions of the conductive materials are removed to form the contacts 195. The contacts 195 may be made of tungsten, aluminum, copper, or other suitable materials.

Subsequently, an inter-metal dielectric (IMD) layer 220 is formed to interconnect the sensing device 100 and at least one of the transistors Ta and Tb. The IMD layer 220 may provide electrical interconnection between the sensing device 100 and the transistors Ta and Tb as well as structural support for the various features of structures formed thereon during many fabrication process operations. In some embodiments, the IMD layer 220 may be silicon oxide, low-k silicon oxide such as a porous silicon oxide layer, other suitable interlayer dielectric (ILD) material, other suitable inter-metal dielectric material, combinations thereof, or the like. In some embodiments, the IMD layer 220 is a low-k dielectric layer made from extra low-k materials, extreme low-k materials, combinations thereof, or the like. In some embodiments, the IMD layer 220 may have a dielectric constant lower than 2.4. The IMD layer 220 also includes conductive elements for interconnecting the sensing device 100 and the transistors Ta and Tb. In some embodiment, the transistor Ta (or Tb) functions as the transistor T of FIG. 2A.

FIGS. 4A-4G illustrate cross-sectional views of intermediate stages in the formation of a sensing device in accordance with some embodiments of the present disclosure. Throughout the various views and illustrative embodiments, like reference numbers are used to designate like elements. It is understood that additional operations can be provided before, during, and after the processes shown by FIGS. 4A-4G, and some of the operations described below can be replaced or eliminated, for additional embodiments of the method. The order of the operations/processes may be interchangeable.

Figure 4A:
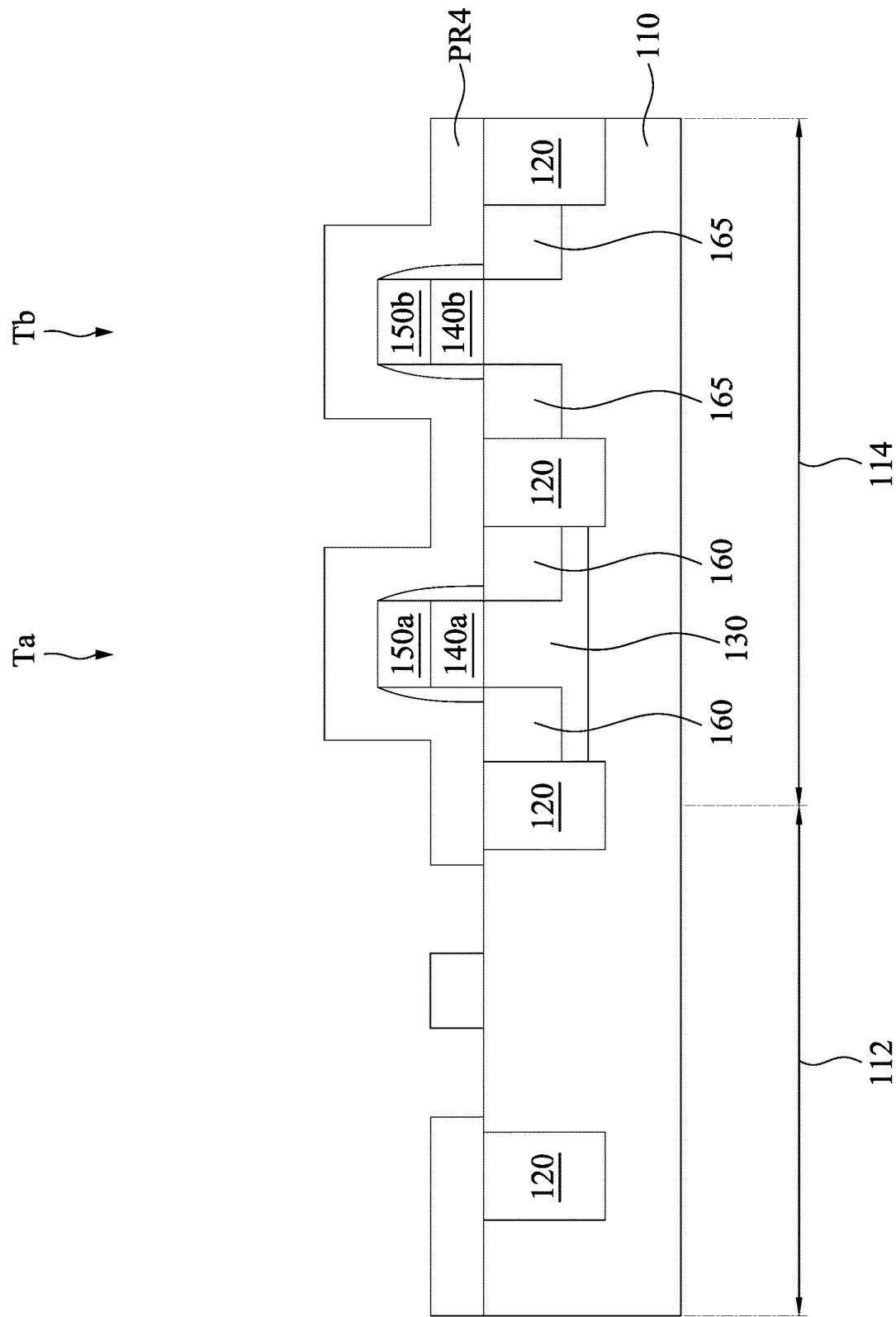
FIGS. 4A-4G illustrate cross-sectional views of intermediate stages in the formation of a sensing device in accordance with some embodiments of the present disclosure.

Reference is made to FIG. 4A. The manufacturing processes of FIGS. 3A-3F are performed first. Since the relevant manufacturing details are all the same as or similar to the embodiments shown in FIGS. 3A-3F, and, therefore, a description in this regard will not be repeated hereinafter. Subsequently, another photoresist PR4 is formed on the semiconductor substrate 110 and exposes portions of a top surface of the sensing region 112 of the semiconductor substrate 110.

Figure 4B:
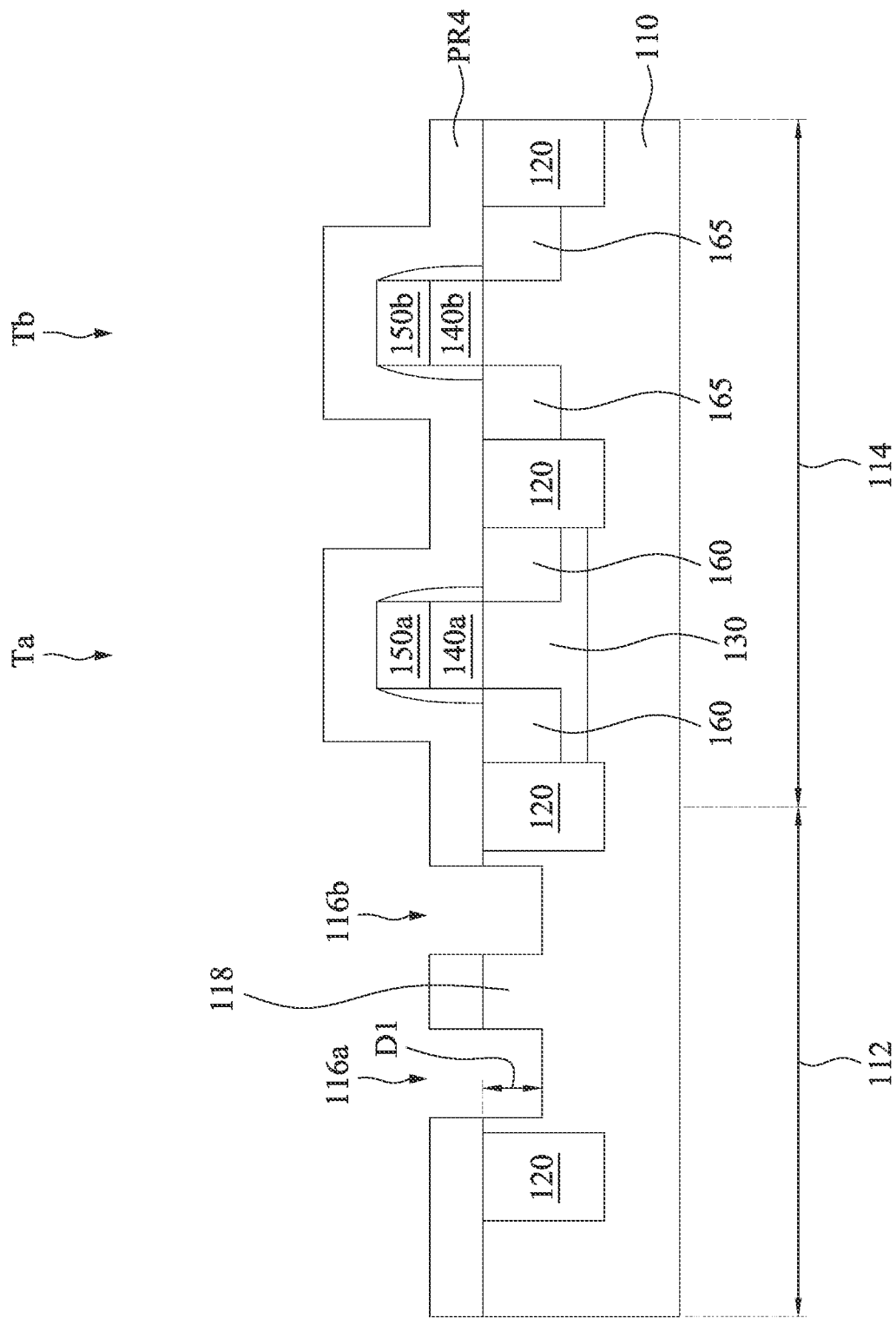

Reference is made to FIG. 4B. A plurality of recesses (e.g., the recesses 116a and 116b) are formed in the semiconductor substrate 110 by using, for example, an etching process. In some embodiments, a depth D1 of the recesses 116a and 116b is in a range from about 200 nm to about 250 nm. The depth D1 is greater than a thickness T4 of the conductive layer 180' (e.g., the thickness of each of the sensing electrodes 184a and 184b) (see FIG. 4E), such that the following formed sensing pad 182 (see FIG. 4E) is spaced apart from the sensing electrodes 184a and 184b. It can be appreciated that any number of the recesses can be formed; the number of the recesses depending on the number of sensing electrodes. For example, as shown in FIG. 4H, there are three sensing electrodes 184a, 184b, and 184c respectively in the recesses 116a, 116b, and 116c. In some embodiments, the number of the recesses can be 1 or greater than 1 (e.g., about 100). Further, as shown in FIG. 4B, a protruding portion 118 of the semiconductor substrate 110 is surrounded by the recesses 116a, 116b (, and 116c as shown in FIG. 4H).

Figure 4C:
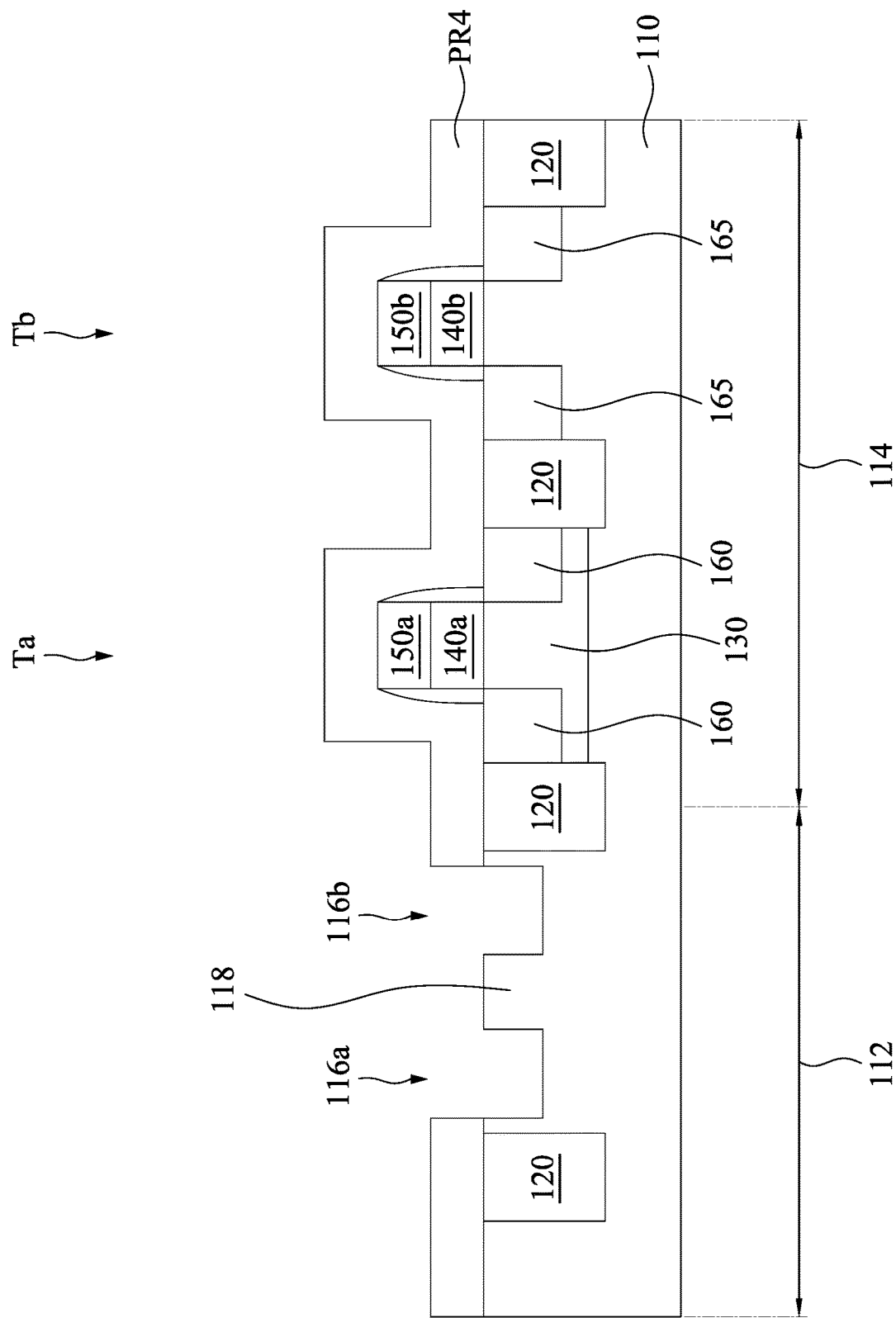

Reference is made to FIG. 4C. The photoresist PR4 in FIG. 4B is stripped, and another photoresist PR5 is formed over the semiconductor substrate 110. The photoresist PR5 covers the structure over the semiconductor substrate 110 but exposes the recesses 116a, 116b, and 116c (see FIG. 4H) and the protruding portion 118.

Figure 4D:
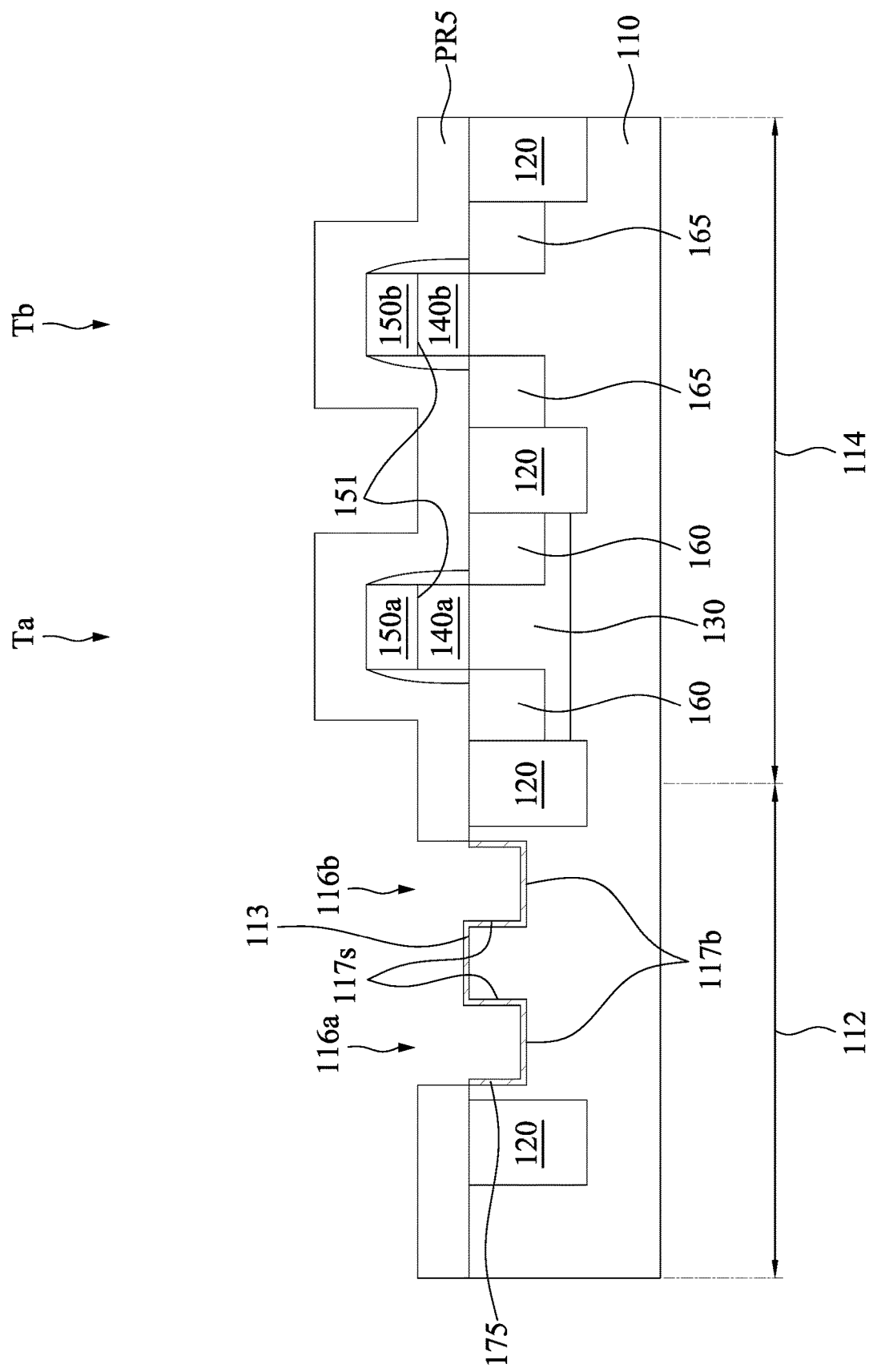

Reference is made to FIG. 4D. A dielectric layer 175 is formed on the top surface of the sensing region 112 of the semiconductor substrate 110 and lining sidewalls 117s and bottom surfaces 117b of the recesses 116a, 116b, and 116c (see FIG. 4H) and the top surface 113 of the substrate 110. The dielectric layer 175 may include a silicon oxide layer. Alternatively, the dielectric layer 175 may optionally include a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. The dielectric layer 175 may be formed using thermal oxide, chemical vapor deposition (CVD), physical vapor deposition (PVD), atomic layer deposition (ALD), other suitable processes, or combinations thereof.

Figure 4E:
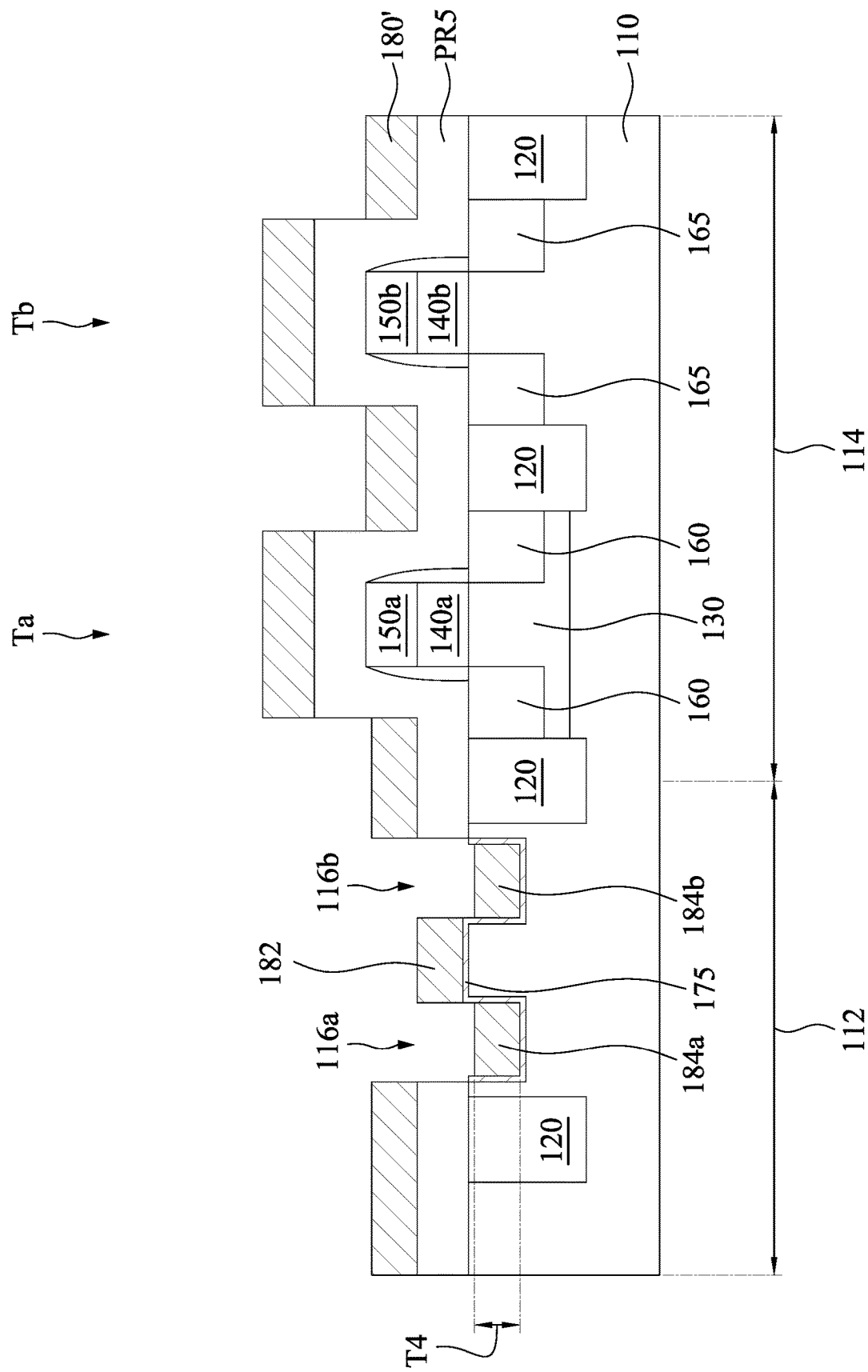

Reference is made to FIG. 4E. Thereafter, a conductive film 180' is formed over the dielectric layer 175 and the photoresist PR5. The conductive film 180' further fills the recesses 116a, 116b, and 116c (see FIG. 4H) and forms sensing electrodes 184a, 184b, and 184c (see FIG. 4H) respectively in the recesses 116a, 116b, and 116c (see FIG. 4H). Also, another portion of the conductive film 180' is deposited on the top surface of the protruding portion 118 and forms a sensing pad 182 surrounded by the sensing electrodes 184a, 184b, and 184c (see FIG. 4H). The conductive film 180' may include a metal such as Al, Cu, W, Ti, Ta, TiN, TaN, NiSi, CoSi, other suitable conductive materials, or combinations thereof. Alternatively, the conductive film 180' may include a polycrystalline silicon (or polysilicon). The conductive film 180' may be formed by CVD, PVD, plating, and other proper processes. The conductive film 180' may have a multilayer structure and may be formed in a multi-step process using a combination of different processes.

Figure 4F:
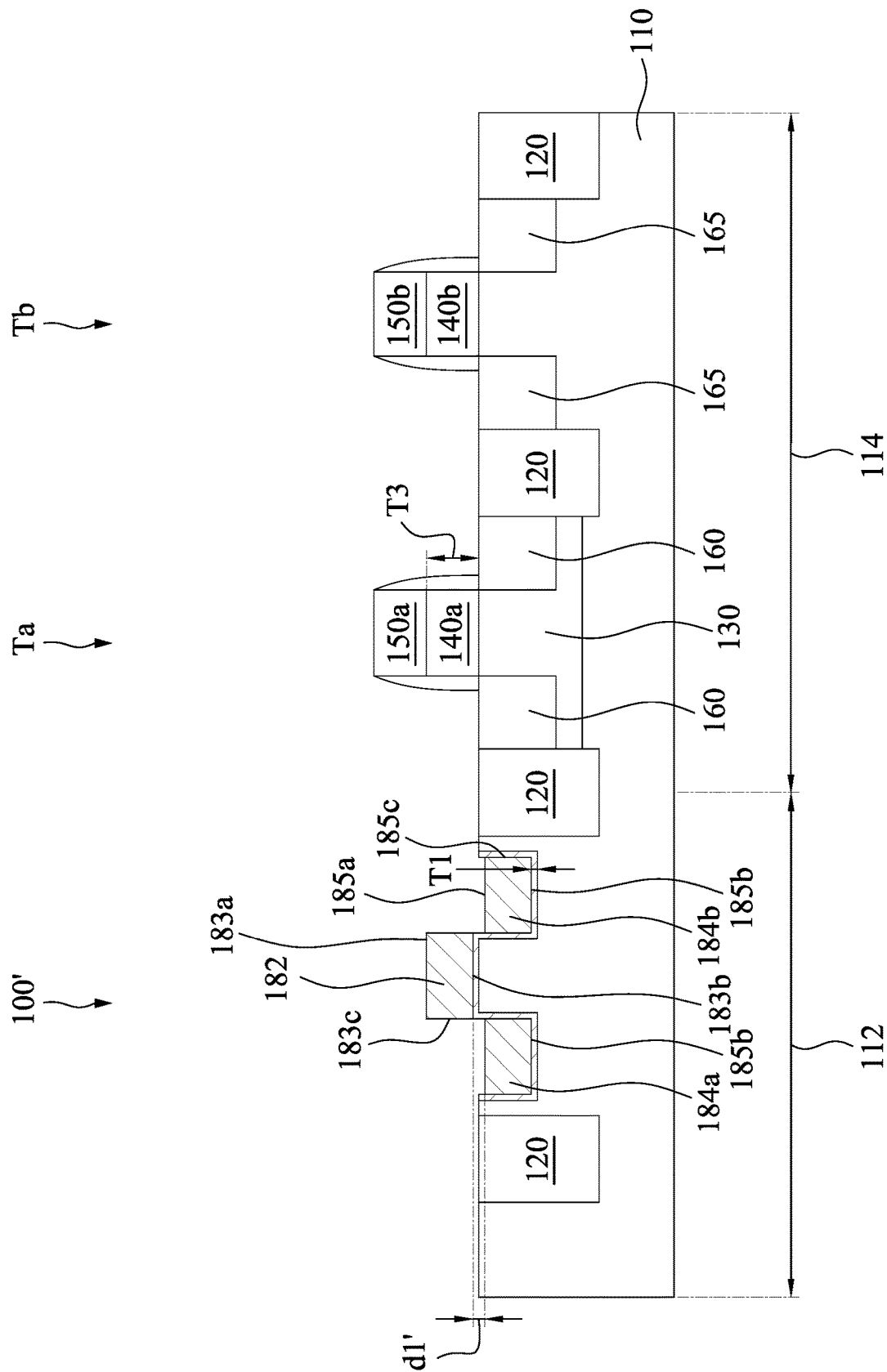

Reference is made to FIG. 4F. The photoresist PR5 (see FIG. 4E) is stripped, such that portions of the conductive film 180' over the photoresist PR5 are removed as well. As such, a sensing device 100' is formed.

FIG. 4H is a top view of the sensing device 100' in FIG. 4F. In FIGS. 4F and 4H, the sensing device 100' includes the semiconductor substrate 110, the dielectric layer 170, the sensing pad 182, and the sensing electrodes 184a, 184b, and 184c. In some embodiments, a thickness T1 of the dielectric layer 170 is smaller than a thickness T3 of each of the gate dielectric layers 140a and 140b. With a thinner thickness T1, the dielectric layer 170 provides the tunneling effect between the sensing pad 182 and the sensing electrodes. With a thicker thickness T3, the gate dielectric layer 140a (140b) provides sufficient isolation between the gate electrode 150a (150b) and the channel of the transistor Ta (Tb).

Further, the sensing electrodes 184a, 184b, and 184c are below the sensing pad 182. That is, the top surface 185a of each of the sensing electrodes 184a, 184b, and 184c is lower than the top surface 183a and the bottom surface 183b of the sensing pad 182. A vertical distance d1' between the top surface 185a of each of the sensing electrodes 184a, 184b, and 184c and the bottom surface 183b of the sensing pad 182 is in a range from about 0.1 nm to about 100 um. Further, the top surface 185a of each of the sensing electrodes 184a, 184b, and 184c is lower than the bottom surface 151 of each of the gate electrodes 150a and 150b.

The dielectric layer 170 is in contact with the bottom surface 183b of the sensing pad 182 but spaced apart from the sidewalls 183c of the sensing pad 182. Moreover, the dielectric layer 170 is in contact with the bottom surface 185b and sidewalls 185c of each of the sensing electrodes 184a, 184b, and 184c.

Figure 4G:
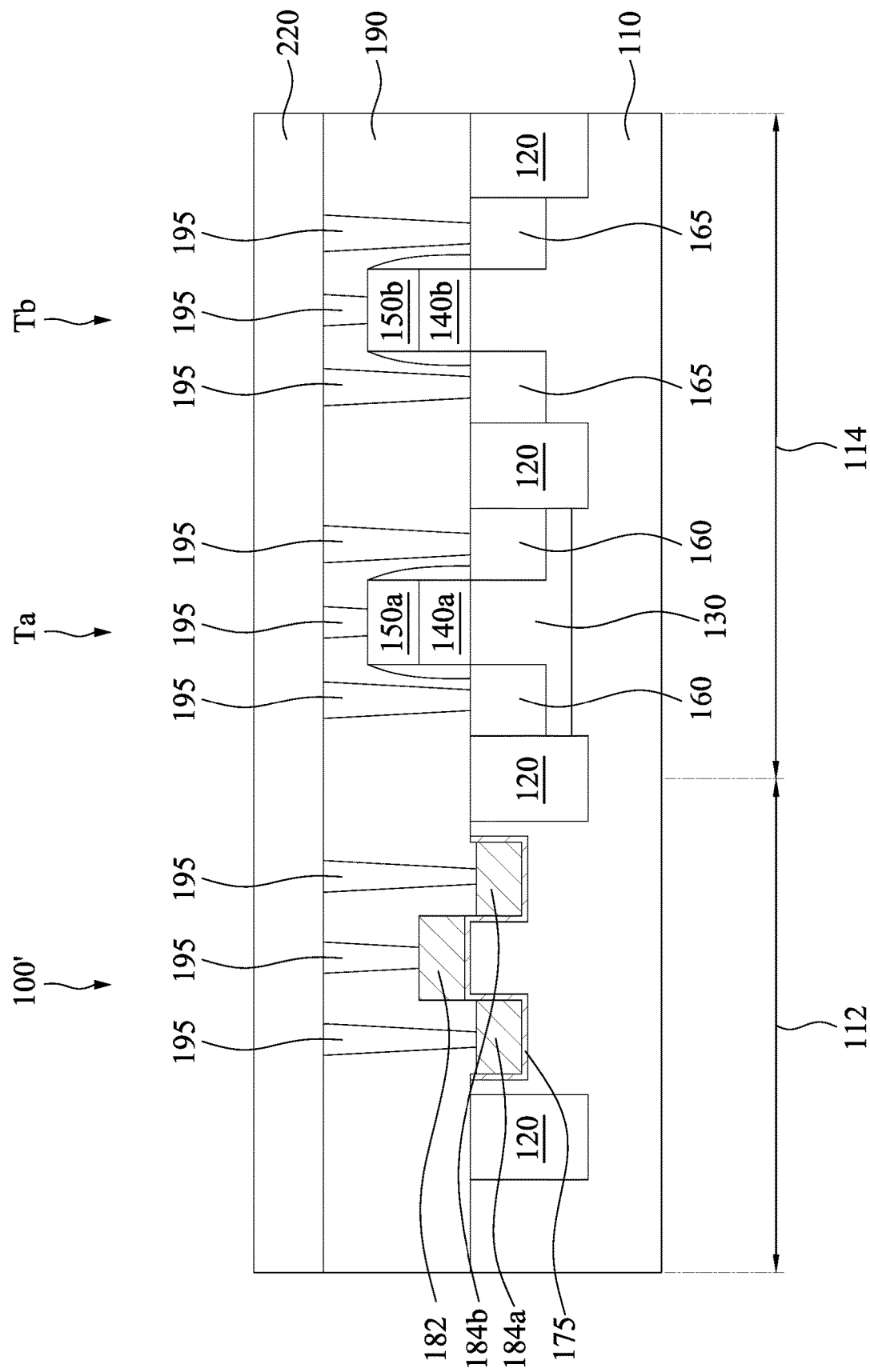
Figure 4H:
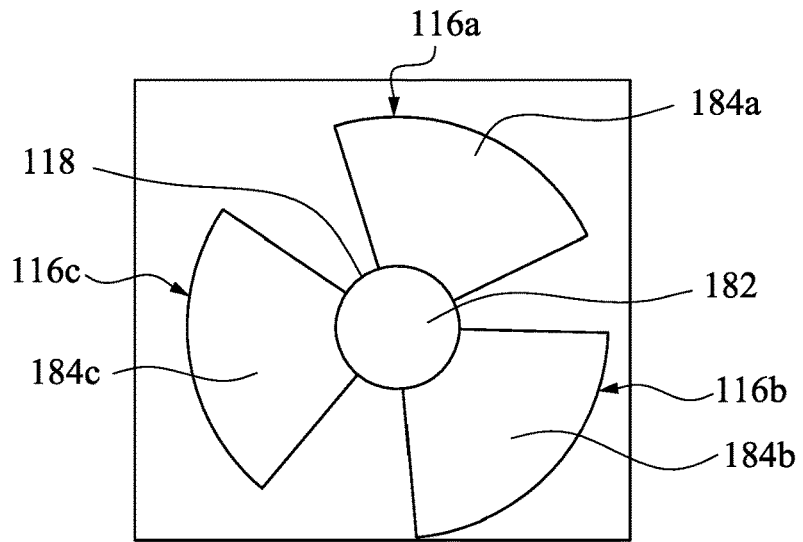
FIG. 4H is a top view of the sensing device in FIG. 4F.

Reference is made to FIG. 4G. An ILD layer 190 is formed over the transistors Ta, Tb, and the sensing device 100', and a plurality of contacts 195 are formed in the ILD layer 190. Subsequently, an IMD layer 220 is formed to interconnect the sensing device 100' and at least one of the transistors Ta and Tb. Materials, configurations, dimensions, processes and/or operations regarding the ILD layer 190 are similar to or the same as the ILD layer 190 of FIG. 3J. Materials, configurations, dimensions, processes and/or operations regarding the contacts 195 are similar to or the same as the contacts 195 of FIG. 3J. Materials, configurations, dimensions, processes and/or operations regarding the IMD layer 220 are similar to or the same as the IMD layer 220 of FIG. 3J.

Figure 5:
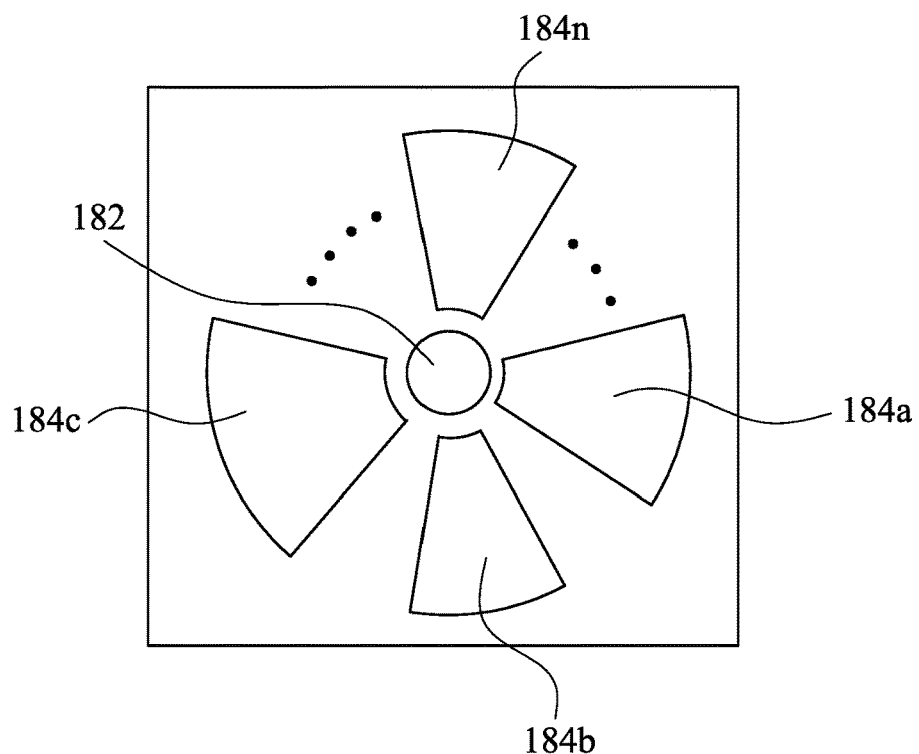
FIG. 5 is a top view of a sensing device 100" in accordance with some embodiments of the present disclosure.

FIG. 5 is a top view of a sensing device 100" in accordance with some embodiments of the present disclosure. The difference between the sensing device 100" in FIG. 5 and the sensing device 100 in FIG. 1A pertains to the configuration of the sensing electrodes. In FIG. 5, the sensing device 100" includes a plurality of sensing electrodes (e.g., 184a, 184b, 184c, . . . , and 184n). The sensing electrodes have different widths (e.g., the width W2 shown in FIG. 1A), different arc lengths (e.g., the arc length L shown in FIG. 1A), and/or different distances (e.g., the distance d1 shown in FIG. 1A). For example, the sensing electrodes 184a and 184c have different widths, and/or a distance between the sensing electrode 184a and the sensing pad 182 is different from a distance between the sensing electrode 184b (or 184c or 184n) and the sensing pad 182. Therefore, the sensing electrodes 184a, 184b, 184c, . . . , and 184n provide different weights to the output signal read from the sensing pad 182. For example, the output signal Vout satisfies:

Vout=b1Vin1+b2Vin2+b3Vin3+ . . . +bnVinn, where b1, b2, b3, bn are the weights of the sensing electrodes 184a, 184b, 184c, . . . , and 184n, and Vin1, Vin2, Vin3, . . . , Vinn are the input voltages applied to the sensing electrodes 184a, 184b, 184c, . . . , and 184n. Other features of the sensing device 100" are similar to or the same as those of the sensing device 100 shown in FIG. 1A, and therefore, a description in this regard will not be provided hereinafter.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that computations of multiple inputs using a single sensing pad can be achieved. Another advantage is that the sensing device enables computations done at room temperature and with low power consumption. Further, the sensing device do not add area burden to the device. Moreover, the formation of the sensing device is compatible with CMOS fabrication.

According to some embodiments, a semiconductor device includes a substrate, a sensing device, and a transistor. The sensing device includes a dielectric layer, a sensing pad, a first sensing electrode, and a second sensing electrode. The dielectric layer is over the substrate. The sensing pad is over and in contact with the dielectric layer. The first sensing electrode and the second sensing electrode are over and in contact with the dielectric layer. The first sensing electrode and the second sensing electrode surround the sensing pad, and a distance between the first sensing electrode and the second sensing electrode is greater than a distance between the sensing pad and the first sensing electrode. The transistor is over the substrate. A gate of the transistor is connected to the sensing pad.

According to some embodiments, a semiconductor device includes a substrate, a sensing device, and a transistor. The substrate has a first recess and a second recess. The sensing device includes a dielectric layer, a first sensing electrode, a second sensing electrode, and a sensing pad. The dielectric layer lines sidewalls and bottom surfaces of the first recess and the second recess and a top surface of the substrate. The first sensing electrode and the second sensing electrode are over the dielectric layer and respectively in the first recess and the second recess. The sensing pad is over the substrate and the dielectric layer. The sensing pad is surrounded by the first sensing electrode and the second sensing electrode. The transistor is over the substrate and is connected to the sensing pad.

According to some embodiments, a method includes depositing isolation structures in a substrate to define a transistor region and a sensing region in the substrate. A transistor is over the transistor region of the substrate. A dielectric layer is disposed over the sensing region of the substrate. A sensing pad and a plurality of sensing electrodes are formed over the dielectric layer. The plurality of sensing electrodes surrounds the sensing pad. An inter-metal dielectric layer is formed over the substrate to electrically interconnect a gate of the transistor and the sensing pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a sensing device comprising:
      a dielectric layer over the substrate;
      a sensing pad over and in contact with the dielectric layer; and
      a first sensing electrode and a second sensing electrode over and physically in contact with the dielectric layer, wherein the first sensing electrode and the second sensing electrode surround the sensing pad, and a distance between the first sensing electrode and the second sensing electrode is greater than a distance between the sensing pad and the first sensing electrode, and the dielectric layer has a first U-shaped cross-sectional profile wrapping around the first sensing electrode, a second U-shaped cross-sectional profile wrapping around the second sensing electrode, and a linear cross-sectional profile continuously extends from the first U-shaped cross-sectional profile to the second U-shaped cross-sectional profile; and a transistor over the substrate, wherein a gate of the transistor is connected to the sensing pad.

2. The semiconductor device of claim 1, further comprising:
a third sensing electrode over and in contact with the dielectric layer, wherein the first, second, and third sensing electrodes surround the sensing pad.

3. The semiconductor device of claim 2, wherein a distance between the first and third sensing electrodes is greater than a distance between the third sensing electrode and the sensing pad.

4. The semiconductor device of claim 2, wherein the first, second, and third sensing electrodes are spaced apart from each other.

5. The semiconductor device of claim 1, wherein the distance between the first sensing electrode and the second sensing electrode is greater than a distance between the sensing pad and the second sensing electrode.

6. The semiconductor device of claim 1, wherein a portion of the dielectric layer having the linear cross-sectional profile extends beneath the sensing pad.

7. The semiconductor device of claim 1, wherein a thickness of a gate dielectric layer of the transistor is greater than a thickness of the dielectric layer of the sensing device.

8. The semiconductor device of claim 1, wherein the sensing pad has a circular top view profile, and the first and second sensing electrodes have annulus sector top view profiles.

9. A semiconductor device comprising:
a substrate having a first recess and a second recess;
a sensing device comprising:
a dielectric layer lining sidewalls and bottom surfaces of the first recess and the second recess and a top surface of the substrate;
a first sensing electrode and a second sensing electrode over the dielectric layer and respectively in the first recess and the second recess; and
a sensing pad over the substrate and the dielectric layer, wherein the sensing pad is surrounded by the first sensing electrode and the second sensing electrode; and
a transistor over the substrate and connected to the sensing pad, wherein from a cross-sectional view, a topmost position of the dielectric layer is at an elevation lower than a topmost position of a gate dielectric layer of the transistor, and a bottommost position of the dielectric layer is at an elevation higher than a bottommost position of a source/drain region of the transistor.

10. The semiconductor device of claim 9, wherein a top surface of the first sensing electrode is lower than a bottom surface of the sensing pad.

11. The semiconductor device of claim 9, wherein a top surface of the first sensing electrode is lower than a bottom surface of a gate electrode of the transistor.

12. The semiconductor device of claim 9, wherein the dielectric layer is in contact with sidewalls and a bottom surface of the first sensing electrode.

13. The semiconductor device of claim 9, wherein the dielectric layer is in contact with a bottom surface of the sensing pad and is spaced apart from sidewalls of the sensing pad.

14. The semiconductor device of claim 9, wherein the dielectric layer has a first U-shaped cross-sectional profile wrapping around the first sensing electrode, a second U-shaped cross-sectional profile wrapping around the second sensing electrode, and a linear cross-sectional profile continuously extends from the first U-shaped cross-sectional profile to the second U-shaped cross-sectional profile.

15. A method comprising:
depositing isolation structures in a substrate to define a transistor region and a sensing region in the substrate;
forming a transistor over the transistor region of the substrate;
depositing a dielectric layer over the sensing region of the substrate;
forming a sensing pad and a first sensing electrode, a second sensing electrode, and a third sensing electrode over the dielectric layer, wherein from a top view, the first, second, and third sensing electrodes surround the sensing pad and spaced apart from each other, and a thickness of a gate dielectric layer of the transistor is greater than a thickness of the dielectric layer; and
forming an inter-metal dielectric layer over the substrate to electrically interconnect a gate of the transistor and the sensing pad.

16. The method of claim 15, further comprising:
forming a first recess, a second recess, and a third recess in the sensing region of the substrate prior to depositing the dielectric layer, wherein portions of the dielectric layer are deposited in the first second, and third recesses, and forming the sensing pad and the first, second, and third sensing electrodes comprises depositing the first, second, and third sensing electrodes in the first, second, and third recesses, respectively, and depositing the sensing pad over a protruding portion of the substrate surrounded by the first, second, and third recesses.

17. The method of claim 15, wherein the step of depositing the dielectric layer is performed after the step of forming the transistor.

18. The method of claim 15, wherein the first, second, and third sensing electrodes have annulus sector top view profiles.

19. The method of claim 15, wherein from a cross-sectional view, a topmost position of the dielectric layer is at an elevation lower than a topmost position of the gate dielectric layer relative to the substrate.

20. The method of claim 15, wherein a bottommost position of the dielectric layer is at an elevation higher than a bottommost position of a source/drain region of the transistor.

* * * * *